(12) United States Patent
Lin et al.

(10) Patent No.: US 7,014,962 B2
(45) Date of Patent: Mar. 21, 2006

(54) HALF TONE ALTERNATING PHASE SHIFT MASKS

(75) Inventors: Qun Ying Lin, Singapore (SG); Sia Kim Tan, Singapore (SG); Soon Yoeng Tan, Johor (MY); Huey Ming Chong, Singapore (SG)

(73) Assignee: Chartered Semiconductor Manufacturing, LTD, Singapore (SG)

( * ) Notice: Subject to any disclaimer, the term of this patent is extended or adjusted under 35 U.S.C. 154(b) by 189 days.

(21) Appl. No.: 10/661,048

(22) Filed: Sep. 13, 2003

(65) Prior Publication Data

US 2005/0058912 A1    Mar. 17, 2005

(51) Int. Cl.
*G01F 9/00* (2006.01)
*G03C 5/00* (2006.01)

(52) U.S. Cl. .......................................... 430/5; 430/311

(58) Field of Classification Search .................... 430/5, 430/311–313, 394
See application file for complete search history.

(56) References Cited

U.S. PATENT DOCUMENTS

| | | | |
|---|---|---|---|
| 5,766,829 A | 6/1998 | Cathey, Jr. et al. | |
| 6,355,399 B1 | 3/2002 | Sajan et al. | |
| 6,410,191 B1 | 6/2002 | Nistler et al. | |
| 6,458,495 B1 | 10/2002 | Tsai et al. | |
| 6,482,554 B1 | 11/2002 | Matsunuma | |
| 2004/0018436 A1 * | 1/2004 | Ishikawa | 430/5 |

OTHER PUBLICATIONS

S. Vaidya, Phase-Shifting Photomasks, Semiconductor fabtech, Edition 1, Issued Sep. 1994, S. Vaidya, AT&T Bell Laboratories, Murray Hill, New Jersey, USA, Website: http://www.semiconductorfabtech.com/features/lithography/articles/body1.171.php3 , May 7, 2003.

John S. Petersen, et al., Development of a Sub-100nm Integrated Imaging System Using Chromeless Phase-Shifting Imaging with Very High NA KrF Exposure and Off-axis Illumination, found on website; http://www.advlitho.com/content/Papers/SPIE_microlith_02/4691-50_Petersen_Conley_et_al.pdf, May. 8, 2003 , discusses Chromeless Phase shift mask techniques.

Gerold, et al., Multiple Pitch Transmission and Phase Analysis of Six Types of Strong Phase-Shifting Masks, This material was presented at SPIE's 26th Annual International Symposium on Microlithography as presentation No. 4346-72 , found on website: http://www.advlitho.com/content/Papers/4346-72paper.pdf May 8, 2003. This reference discusses alternating phase shift masks.

Armen Kroyan and Hua-yu Liu, Effects of altPSM Design on Image Imbalance for 65 nm, Semiconductor International, Feb. 1, 2003 http://www.e-insite.net/semiconductor/index.asp?layout=article&articleId=CA273367&spacedesc=webex).

* cited by examiner

*Primary Examiner*—S. Rosasco
(74) *Attorney, Agent, or Firm*—William J Stoffel

(57) ABSTRACT

A structure, a method of fabricating and a method of using a phase shift mask (PSM) having a first phase shifted section, a half tone section, and a second phase shifted section. The first phase shift section and the half tone section are shifted 180 degrees with the second phase shift region. Embodiments provide for (1) a half tone, single trench alternating phase shift mask and (2) a half tone, dual trench alternating phase shift mask. The half tone region provides advantages over conventional alternating phase shift masks.

57 Claims, 15 Drawing Sheets

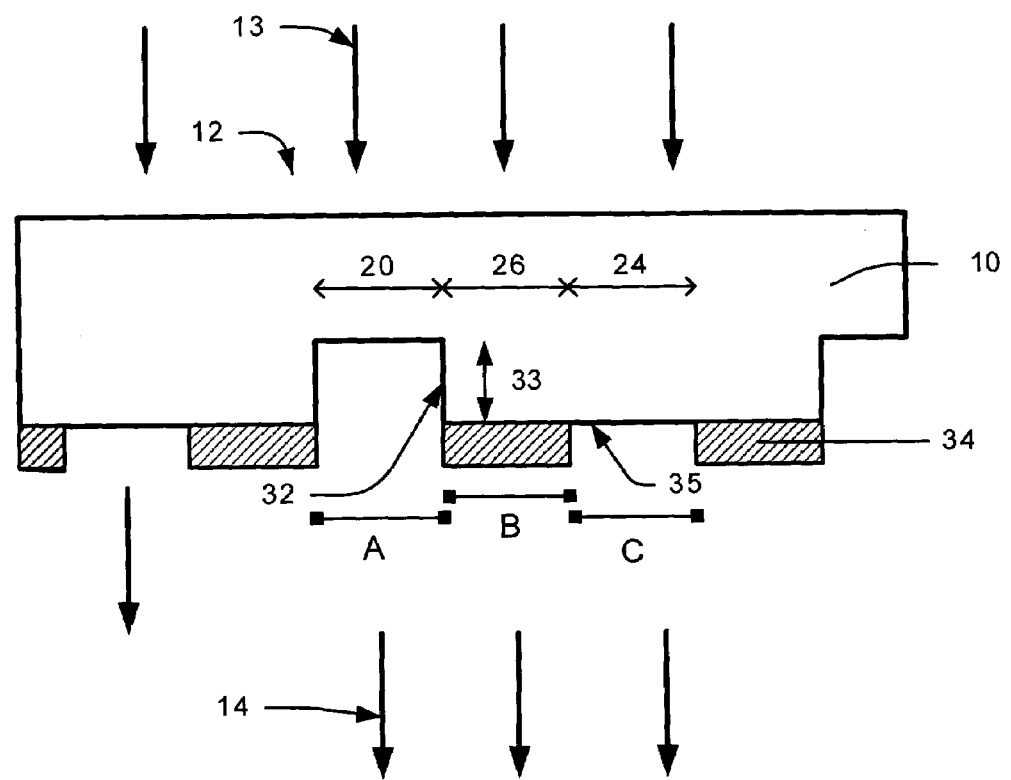
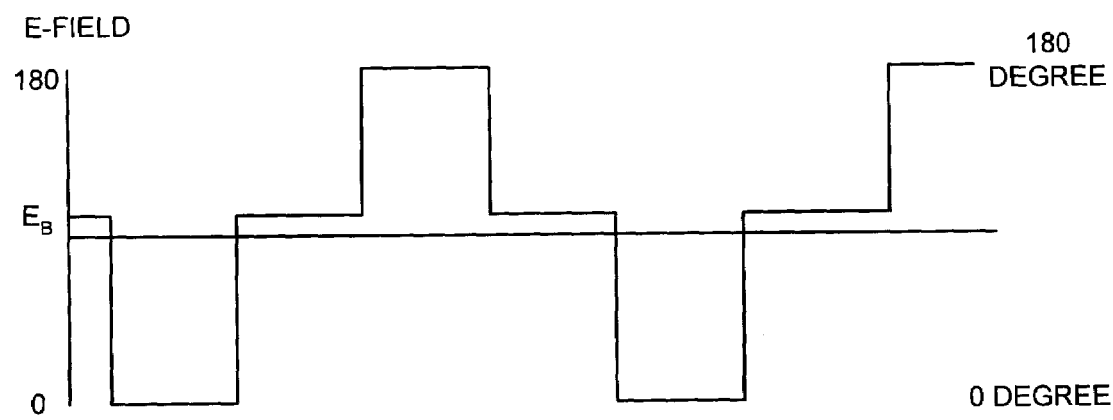
FIGURE 2

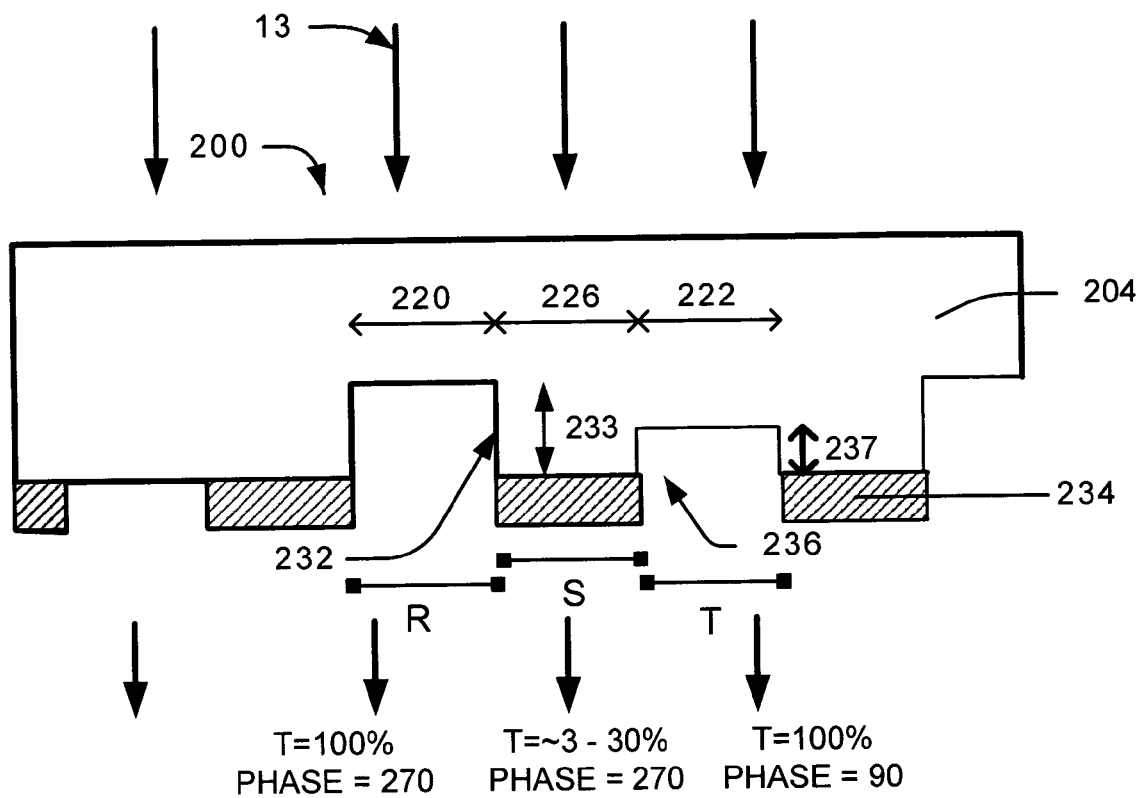
FIGURE 5
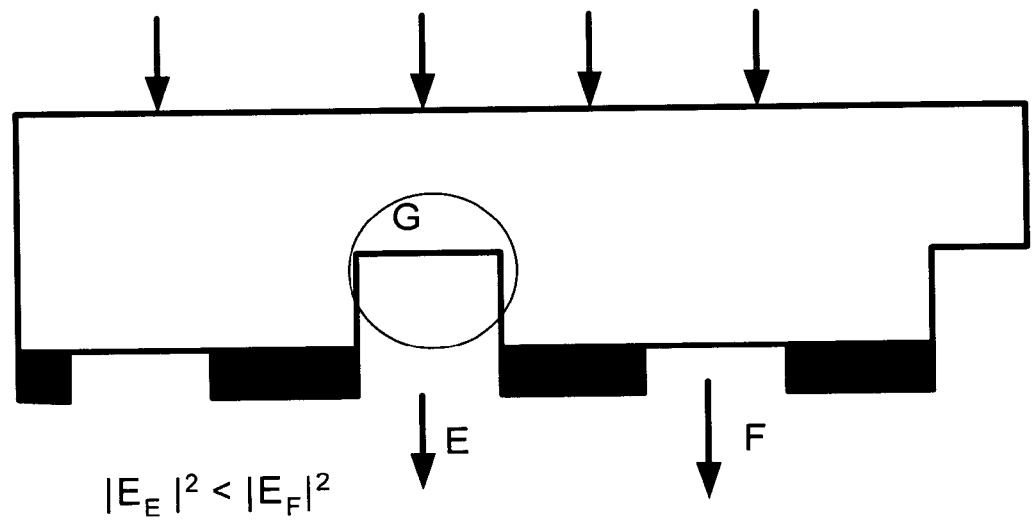
FIGURE 7               --- PRIOR ART

HALF TONE ALTERNATING PHASE SHIFT MASKS

BACKGROUND OF INVENTION

1) Field of the Invention

This invention relates generally to microelectronic masks and mask fabrication methods and more particularly to phase shift masks and fabrication methods thereof.

2) Description of the Prior Art

As integrated circuit devices such as semiconductor devices become more densely integrated, it may become increasingly difficult to form uniform patterns therein. This problem can be reduced or eliminated by using phase shift mask (PSM) structures rather than conventional photo mask structures. In particular, a Levenson PSM (or alternating PSM) may be used to form a uniform pattern. A Levenson PSM includes an etched portion in a PSM substrate. A Levenson PSM is described in detail in U.S. Pat. No. 5,358,827.

A conventional Levenson PSM is formed by sequentially forming a phase shift layer pattern and a chrome layer pattern which expose spaced apart regions of a PSM substrate. A trench having a predetermined depth is formed in one of the exposed regions. The phase of radiation such as light, which is incident on the region where the trench is formed is shifted by an angle of 180 degree. Thus, the region in which the trench is formed becomes a phase shift region. The phase of a light incident on the other exposed region is not shifted. Thus, the region in which a trench is not formed becomes an unshifted phase region.

Unfortunately, when the light passing through the phase shift region is out of focus, the image of a pattern may deteriorate. Thus, the difference D of a critical dimension (hereinafter, referred to as a CD) between patterns respectively formed by light passing through the phase shift region and the unshifted phase region may become large. In order to solve this problem, an undercut can be formed on the PSM substrate on which the trench is formed, or a material having a high refractivity can be used to reduce the step difference of the trench. However, these methods may not completely solve this problem.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,410,191B(Nistler et al.) that shows a single trench alternating PSM.

U.S. Pat. No. 5,766,829(Cathey, Jr. et al.) shows a chromeless phase shift mask comprised of a pattern of parallel spaced phase shifters.

U.S. Pat. No. 6,458,495B1(Tsai, et al.) shows a dual trench with undercut, alt-PSM.

U.S. Pat. No. 6,355,399b1(Sajan et al.) shows a method for a dual damascene pattern comprising: exposing a one photoresist layers using a grey tone mask.

U.S. Pat. No. 6,482,554(Matsunuma) shows a method for a dual damascene pattern comprising: exposing two photoresist layers using a grey (tri-tone) mask.

S. Vaidya, *Phase-Shifting Photomasks,* Semiconductor fabtech, Edition 1, Issued September 1994, S. Vaidya, AT&T Bell Laboratories, Murray Hill, N.J., USA, Website:

http://www.semiconductorfabtech.com/features/lithography/articles/body1.171.php3, May 7, 2003

John S. Petersen, et al., Development of a Sub-100 nm Integrated Imaging System Using Chromeless Phase-Shifting Imaging with Very High NA KrF Exposure and Off-axis Illumination, found on website;

http://www.advlitho.com/content/Papers/SPIE microlith 02/4691-50 Petersen Conley et al.pdf, May 8, 2003, discusses Chromeless Phase shift mask techniques.

Gerold, et al., *Multiple Pitch Transmission and Phase Analysis of Six Types of Strong Phase-Shifting Masks,* This material was presented at SPIE's 26th Annual International Symposium on Microlithography as presentation number 4346-72, found on website: http://www.advlitho.com/content/Papers/4346-72paper.pdf May 8, 2003. This reference discusses alternating phase shift masks.

Armen Kroyan and Hua-yu Liu, *Effects of altPSM Design on Image Imbalance for 65 nm, Semiconductor International,* Feb. 1, 2003 http://www.e-insite.net/semiconductor/index.asp?layout=article&articleId=CA273367&spacedesc=webe x)

SUMMARY OF THE INVENTION

It is an object of embodiments of the present invention to provide a structure and a method for fabricating an optical mask that overcome some of the disadvantages of the Levenson phase shifting mask.

It is an object of embodiments of the present invention to provide a structure and a method for fabricating a single trench-half tone phase shift mask.

It is an object of embodiments of the present invention to provide a structure and a method for fabricating a dual trench-half tone phase shift mask.

Embodiments of the present invention provides a structure and method of manufacturing a phase shift mask which is characterized below.

An example embodiment of the invention comprises a structure for a half tone alternating phase shift mask. The phase shift mask comprises the following:

a first phase shift section, a half tone section, and a second phase shift section;

the first phase shift section adjacent to the half tone section;

the half tone section adjacent to the second phase shift section;

the first phase shift section and half tone section changing the phase of incident light by about 180 degrees with respect to the second phase shift section.

A example embodiment of a method for forming a single trench half tone alternating phase shift mask comprises the following:

a) providing a substrate having a phase shift region, a half tone region and an unshifted phase region; the phase shift region adjacent to the half tone region; the half tone region adjacent to the unshifted phase region;

b) forming a half tone layer on the substrate in the half tone region; the half tone layer has a phase shift of about 180 degrees with the unshifted phase region, the half tone layer has a transmittance between about 3 and 30%;

c) forming a trench in the substrate in the phase shift region; the phase shift region has an about 180 degree phase shift with the unshifted phase region.

d) forming a trench in the substrate in the phase shift region; the phase shift region has an about 180 degree phase shift with the unshifted phase region.

A example embodiment of a method for forming a single trench half tone alternating phase shift mask comprises the following:
a) providing a mask substrate having a first phase shift region, a half tone region and an second phase shift region;
b) the first phase shift region adjacent to the half tone region; the half tone region adjacent to the second phase shift region;
c) forming a first trench in the substrate in the first phase shift region; the phase shift region has an about 180 degree phase shift with the unshifted phase region, the first phase shift region has about a 100% transmittance;
d) forming a half tone layer on the mask substrate in the half tone region; the half tone section has a phase shift of about 180 degrees with the first phase shift region; the half tone layer has a transmittance between about 0 and 100%;
e) forming a second trench in the substrate in the second phase shift region; the second phase shift region has an about 180 degree phase shift with the first phase shift region.

An example embodiment for a method of fabricating a semiconductor device comprises the following:
a) providing a phase shift mask comprising:
  (1) a mask substrate having a first phase shift section, a half tone section and a second phase section;
    the first phase shift section adjacent to the half tone section;
    the half tone section adjacent to the second phase section;
    the first phase shift section and the half tone layer have about a 180 degree phase shift with the second phase section;
    the half tone layer has a transmittance between about 0.1 and 98%;
b) transmitting radiation through portions of the phase shift mask to expose a pattern of photoresist overlying a semiconductor workpiece; and
c) utilizing the patterned photoresist to fabricate a semiconductor device.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of an alternating PSM according to the present invention and further details of a process of fabricating and using such a mask in accordance with the present invention will be more clearly understood from the following description taken in conjunction with the accompanying drawings in which like reference numerals designate similar or corresponding elements, regions and portions and in which:

FIG. 2 is a cross sectional view of a single trench half tone alternating phase shift mask and graph of E-field according to an embodiment of the present invention.

FIG. 5 is a cross sectional view of a dual trench half tone alternating phase shift mask according to an embodiment of the present invention.

FIG. 7 is a cross sectional view of a Levenson (alternating) PSM according to the prior art.

DETAILED DESCRIPTION OF THE PREFERRED EMBODIMENTS

The embodiments of the present invention will be described in detail with reference to the accompanying drawings.

The embodiments provide a phase shift mask having a first phase shift section, a half tone section, and a second phase shift section. The embodiments' half tone section assists in balancing the intensity between light passing thru the first phase shift section and the second phase shift section.

Two mask embodiments comprise (1) a single trench half tone phase shift mask and (2) a dual trench half tone phase shift mask. Other embodiments include methods for making the masks and using the masks to make devices.

FIG. 1 shows a first embodiment of an single trench, half tone, alternating phase shift mask.

FIG. 5 shows a second embodiment of a dual trench, half tone, alternating phase shift mask. The half tone regions provide advantages over conventional phase shift masks.

Structure for Single Trench Half Tone Alternating PSM (alt-PSM)

A first example embodiment of the invention is a single trench half tone alternating phase shift mask (alt-PSM).

Figure 1A:
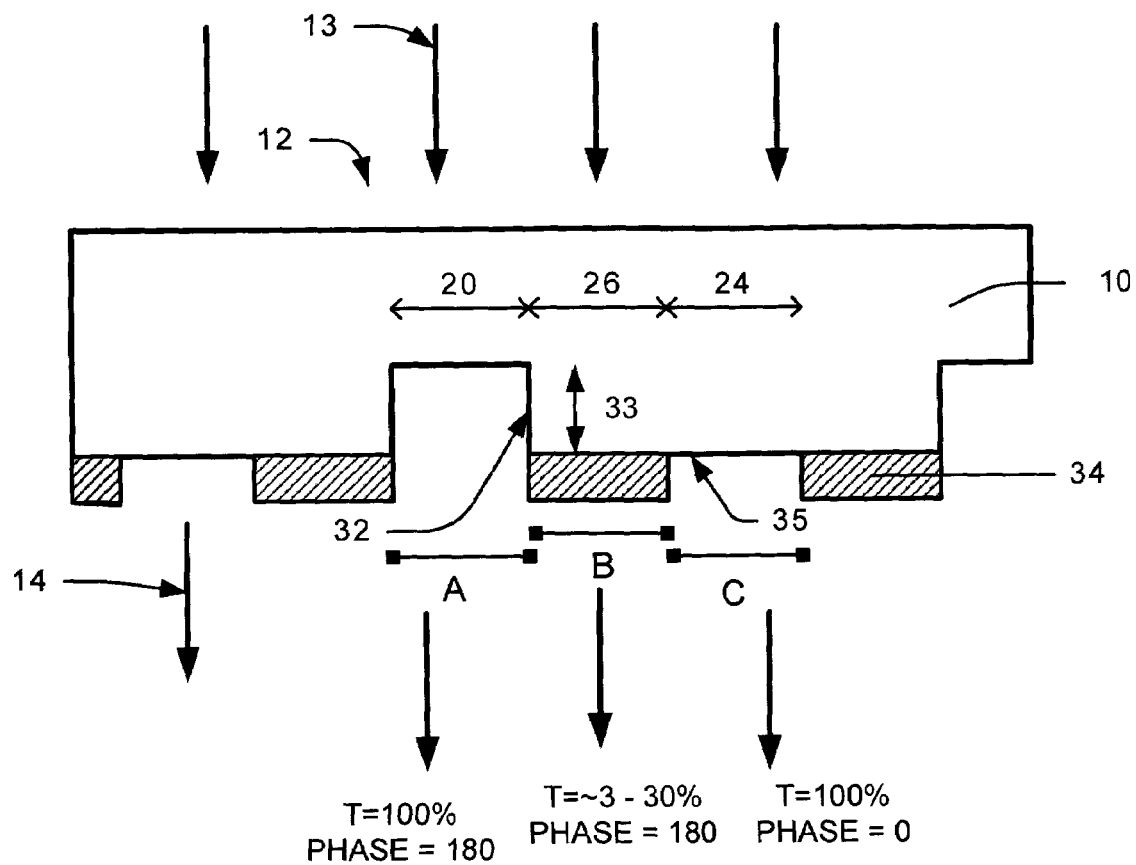
FIG. 1A is a cross sectional view of a single trench half tone alternating phase shift mask according to an embodiment of the present invention.

A. A First Phase Shift Section A, a Half Tone Section B, and a Second Phase Shift Section C Referring to FIG. 1A, the mask 12 preferably comprises a first phase shift section A, a half tone section B, and a second phase shift section (or unshifted phase section) C. The first phase shift section A is adjacent to the half tone section. The half tone section B is adjacent to the second phase shift section. Preferably as shown in FIG. 1A, there is no opaque section in the half tone region between the first and second phase shift sections A and C.

The first phase shift section and half tone section change the phase of incident light 13 by about 180 degrees with respect to the second phase shift section (or unshifted phase section) C. In this embodiment the first phase shift section comprises a (first) phase shift region 20 of the mask substrate 10. The half tone section comprises a half tone layer 34 over a half tone region 26 of the mask substrate. The second phase shift section C comprises an unshifted phase region (or second phase shift region) 24 of the mask substrate. The unshifted phase region preferably comprises a un-etched/un-thinned substrate surface 35.

We provide a mask substrate 10. The substrate preferably has at least a (first) phase shift region 20, a half tone region 26, an unshifted phase region (or second phase shift region) 24 and an opaque region (See FIG. 4L (30)). Light entering the mask and exiting the mask in these regions may have changed phase and intensity. The mask is preferably for use with light at a wavelength preferably between 157 and 248 nm and more preferably 157 nm, 193 nm or 248 nm. Preferably the mask is exposed using Convention/Standard illumination with low parital coherency factor: between ~0.20 and 0.40.

The phase shift region 20 is adjacent to the half tone region. The half tone region is adjacent to the unshifted phase region 24.

The substrate is preferably mask substrate such as a mask blank comprised of quartz.

FIG. 1A shows incident light 13 entering the rear side of the mask 12 and transmitted light 14 exiting the mask.

B. Phase Shift Region 20

A trench 32 is in the substrate 10 in the phase shift region (20). The phase shift region 20 has an about 180 degree phase shift with the unshifted phase region (24). The trench has a first depth 33 such the light at the wavelength transmitted through the phase shift region (20) is shifted in phase by about 180 degrees relative to the light at the wavelength transmitted through the unshifted phase region (24). The phase shift region (20) has about a 100% transmittance.

C. Half Tone Region 26

A half tone layer 34 (or partially transmitting phase layer) is over the mask substrate 10 in the half tone region 26. The half tone region comprises the mask substrate and the half tone layer) over the mask substrate in the area. Light transmitted thru the half tone region 26 (B) is phase shifted about 180 degrees with respect to transmitted light passing thru the unshifted phase region (24). The half tone layer 34 phase shifts light an amount depending on the line and space width target to be imaged on the wafer and the process.

The half tone layer preferably has a transmittance between about 3 and 30%.

Figure 3A:
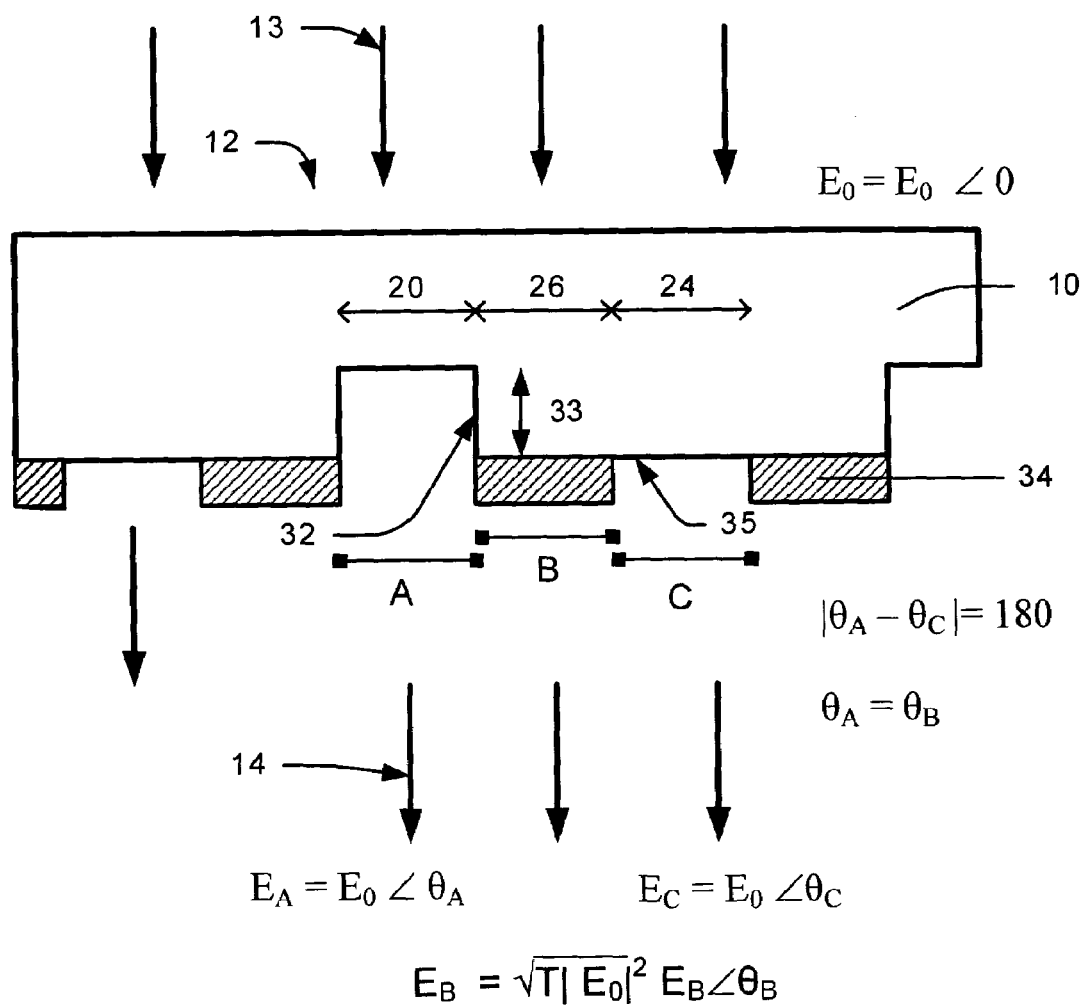
FIG. 3A is a cross sectional view of a single trench half tone phase shift mask and E-field equations according to an embodiment of the present invention.

Referring to FIG. 3A, transmitted light thru phase shift region A is about 180 degrees out of phase with light transmitted thru unshifted region (24). Light thru half tone region (26) is about in phase with transmitted light thru phase shift region A.

The half tone layer can be comprised of one or more layers. For example, the half tone layer be made of 2 layers with a first layer to reduce transmission and $2^{nd}$ layer to phase shift light. If the half tone layer is comprised of 2 or more layers, the edges of the layers are preferably even.

D. Unshifted (or Second) Phase Region 24

The unshifted phase region 24 preferably has a transmission of about 100% and about a 0 degree phase shift with incoming light. That is, if light (e.g., incident light 13) entering the mask 12 from the back side is at a 0 phase degrees, then light (e.g., transmitted light 14) passing out of the mask in the unshifted phase region 24 has a phase shift of about 0 degrees.

In actual application, the phase of the light entering the mask with respect to the unshifted phase region 24 is not important. The light entering can be in any phase degree. The phase is important only when the light exits the mask (transmitted light).

E. Opaque Region

Figure 4A:
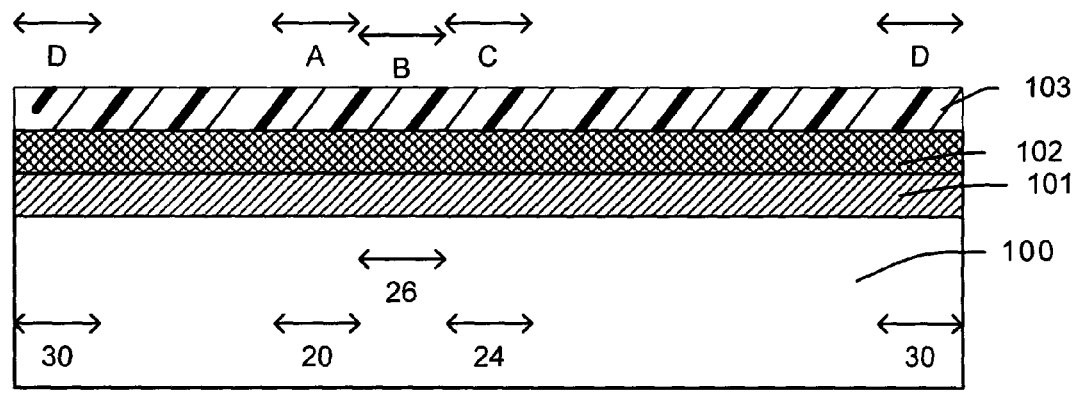
FIGS. 4A thru 4L are cross sectional views of a process to make a single trench half tone alternating phase shift mask according to an embodiment of the present invention.
Figure 4B:
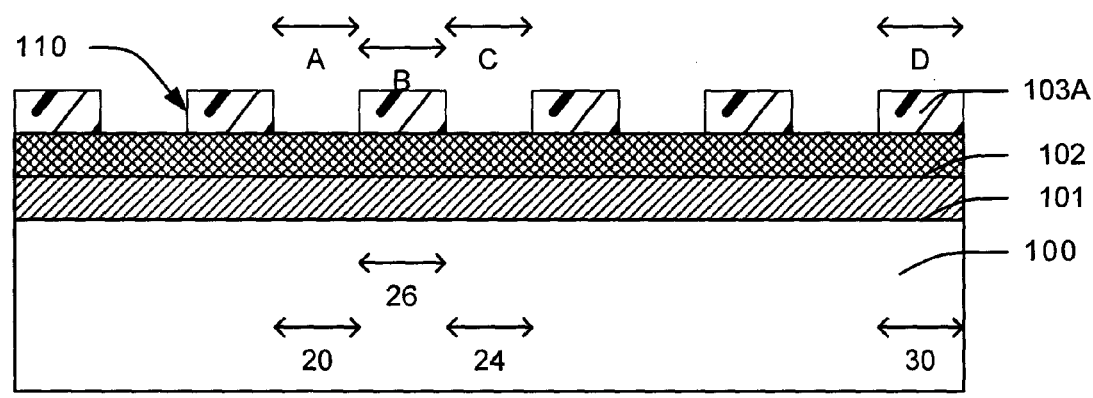
Figure 4C:
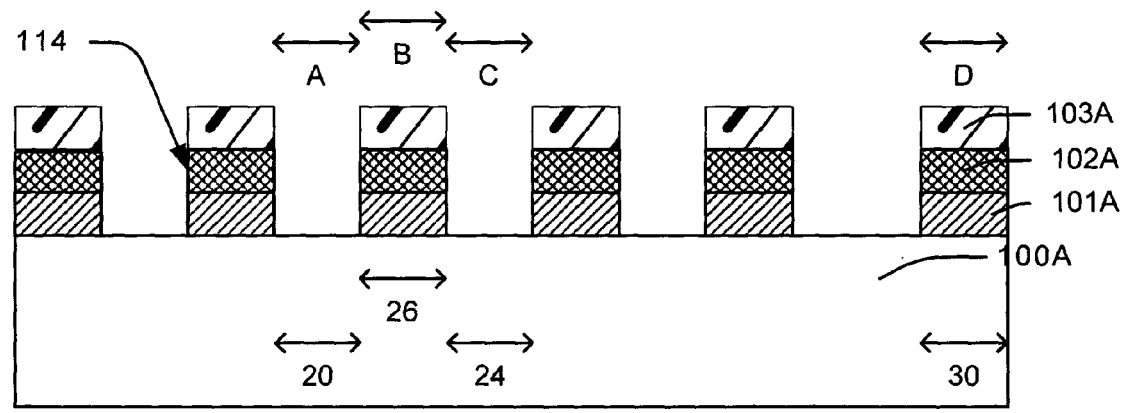
Figure 4D:
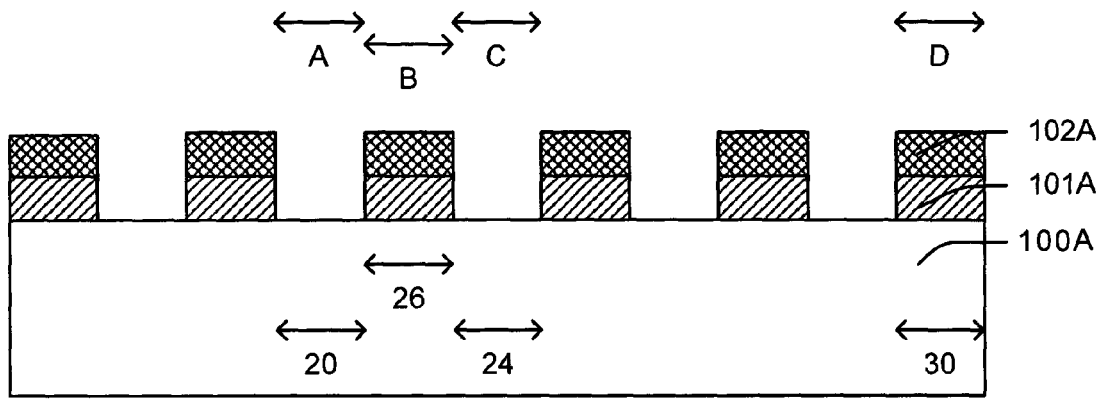
Figure 4E:
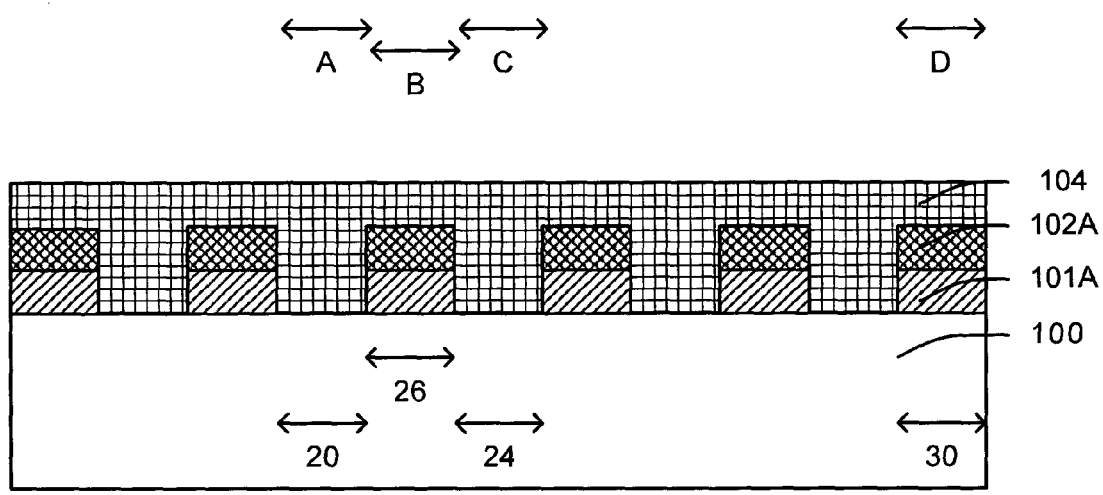
Figure 4F:
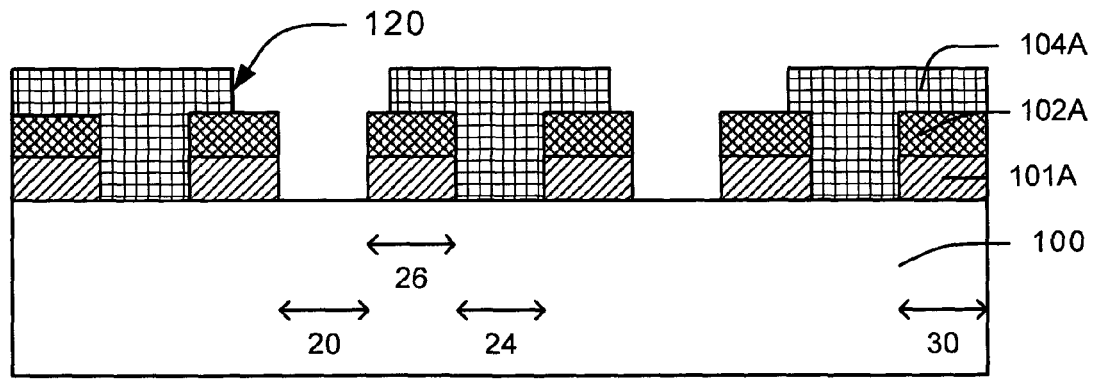
Figure 4G:
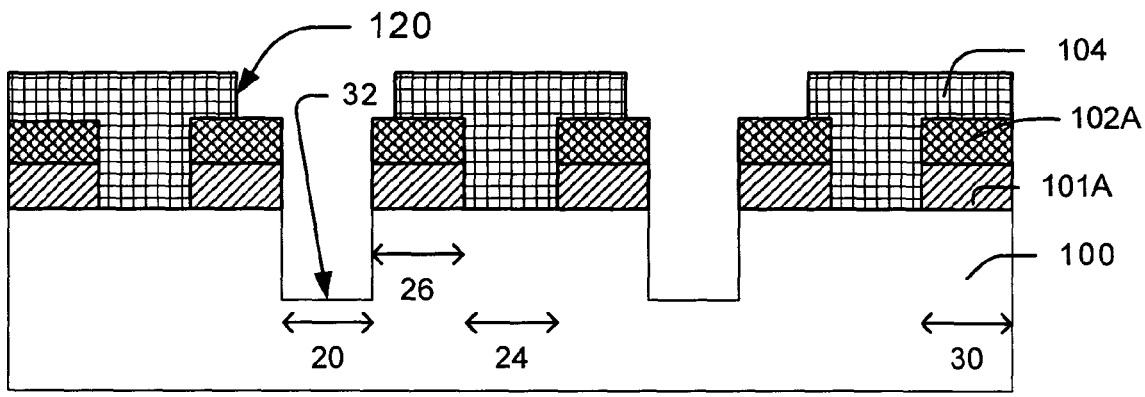
Figure 4H:
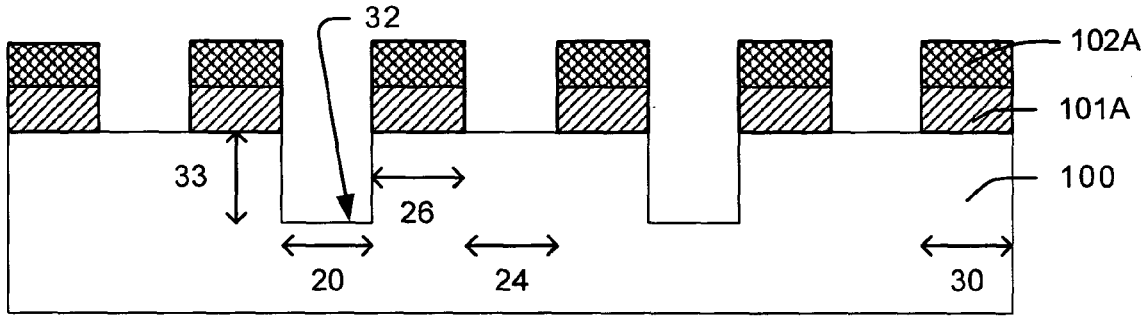
Figure 4I:
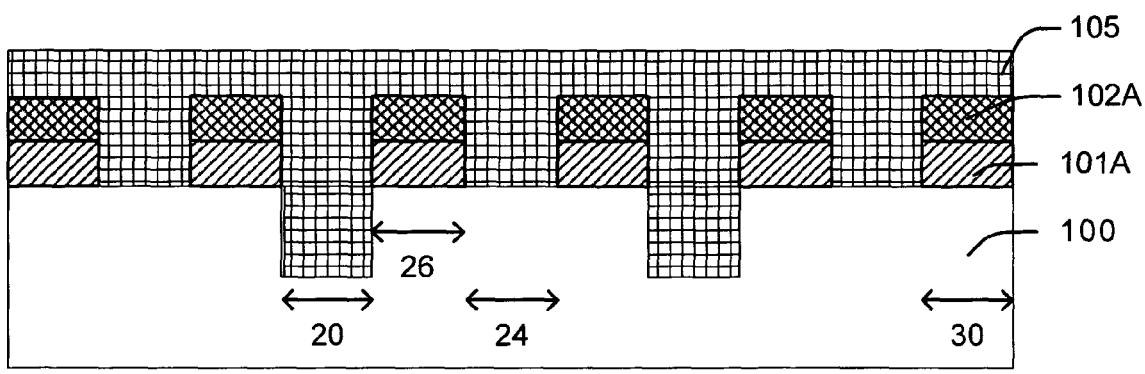
Figure 4J:
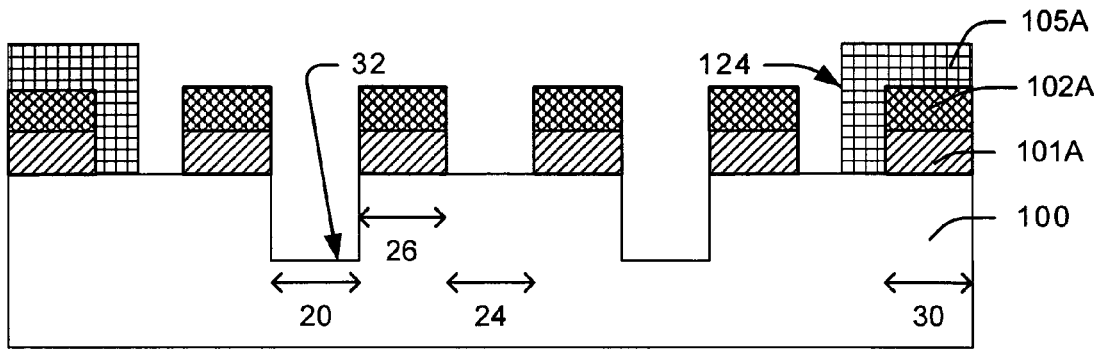
Figure 4K:
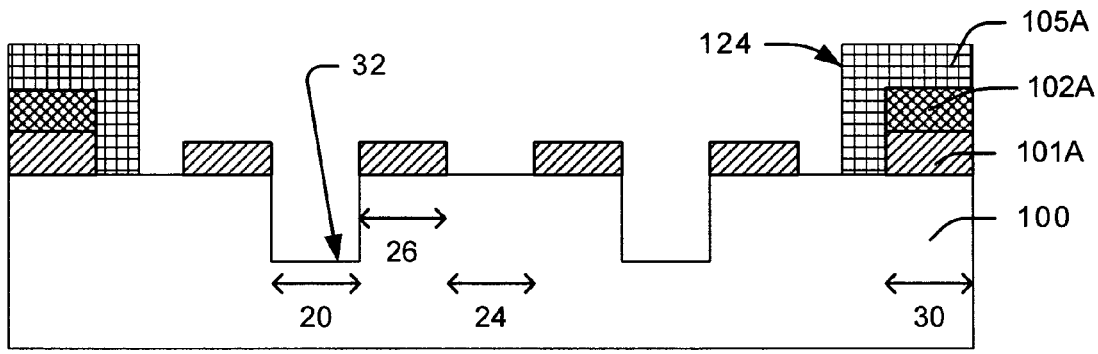
Figure 4L:
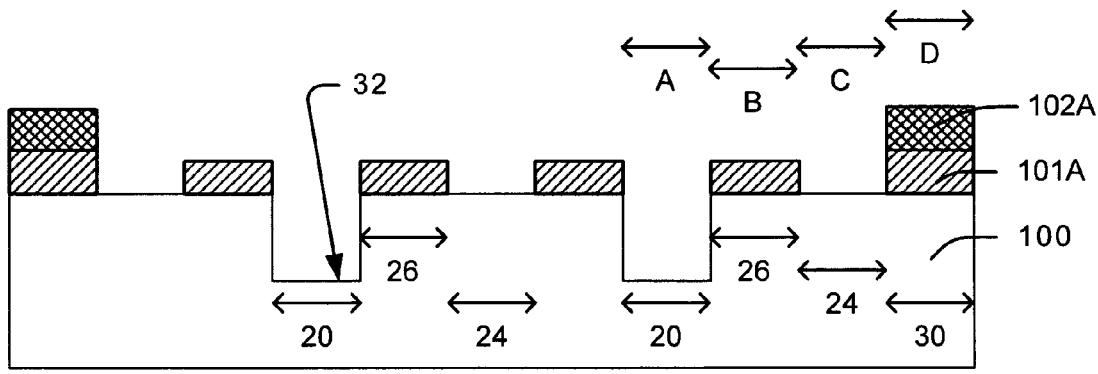

Referring to FIG. 4L, (region 30) an opaque layer 102B is formed over the substrate 100. Preferably the opaque layer is formed on the at least the edges of the mask. The opaque regions are also present on masks so that the machine (scanner and/or stepper) can use the registration marks and labels pattern on it for alignment of the mask to the wafer stage as well as reticle identification.

Figure 1B:
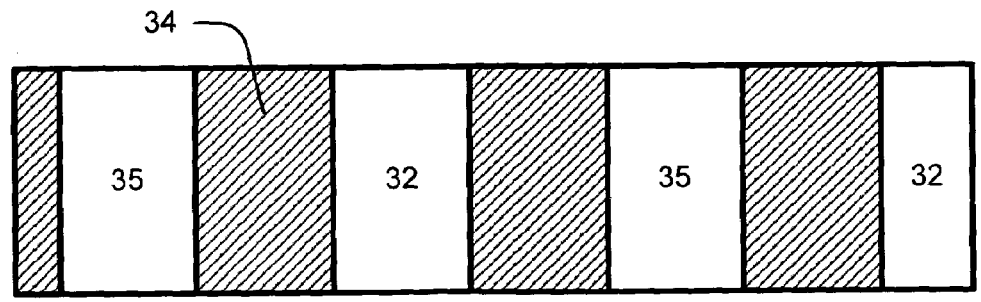
FIG. 1B is a top plan view of a single trench half tone alternating phase shift mask according to an embodiment of the present invention.

FIG. 1B shows a top down view of the mask section shown in FIG. 1A.

A summary of the characteristics of the single trench half tone alternating phase shift mask is shown below in table 1.

TABLE 1

Characteristic of single trench half tone alternating phase shift mask.

| Region | phase shift of transmitted light (degrees) | transmittance (%) |
|---|---|---|
| phase shift region (20) | 180 degrees<br>range = 178 to 182 degrees | 100%<br>range = 95 to 100% |
| half tone region (26) and half tone layer | 180 degree<br>range = 178 to 182 degrees | preferred range = 3 to 30%<br>range = 0.1 to 98% |
| unshifted phase region (24) | 0 degrees<br>range = −2 to 2 degrees | range = 0 to 100% |
| opaque region (30) | 0 degrees | 0% |

F. E-field Graph

FIG. 2 shows a graph of e-field strength for the various regions of the single trench half tone alt-PSM 12. The single trench half tone alt-PSM 12 is shown in the upper area of FIG. 2. The amplitude of $E_B$ is dependent on the light transmission thru the half tone material.

G. Phase Shift and Transmittance

FIG. 3A shows a cross section of the Single trench half tone alt-psm and the equations for Electric field (E) for light passing thru the three regions of the mask: A—phase shift section ), B—half tone section, and C—unshifted section.

Where:
E is Electric field
θ is phase
T is transmittance

The light entering the quartz substrate can be any phase. For simplicity, let the phase angle be 0. The transmitted light leaving the mask at sections A and C is about 180 degree out of phase. The light transmitted thru section B is about in phase with the light transmitted thru section A.

H. Intensity Simulation

Figure 3B:
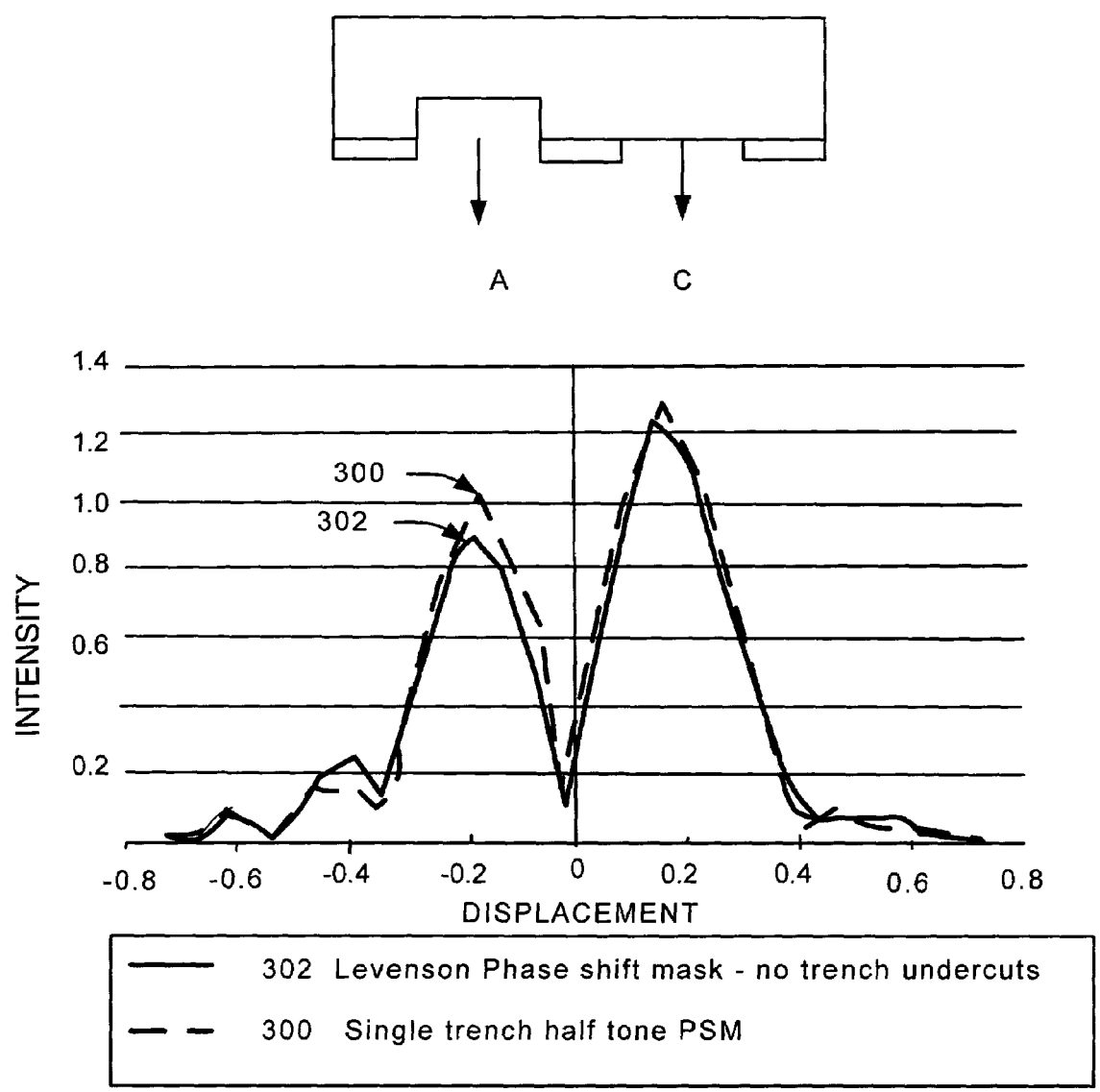
FIG. 3B shows a intensity simulation showing Intensity vs displacement for a levenson mask and the embodiments' single trench half tone alt-PSM.

FIG. 3B shows an intensity simulation for the embodiment's single trench half tone alternating PSM. The figure shows Two curves: (302) levenson PSM (opaque layer on substrate between openings) with no undercuts, and (300) the embodiment's single trench half tone alternating PSM. The masks have equal line width and space of 0.18 μm at 0.248 μm wavelength illumination.

Compared to the levenson PSM, the embodiment's single trench half tone alternating PSM (302) has more equal balance intensity thru the two openings.

For (300) the embodiment's single trench half tone alternating PSM, the lesser imbalance in intensity at the first opening/section (A) and second opening/section (C) regions can be seen. An advantage of the embodiment is that the transmission % of the half tone material 34 can be adjusted to increase the intensity at first phase shift section A. The transmission % of the half tone material can adjusted to determine the optimum intensity thru phase shift section A to balance with the intensity thru the other opening in section C.

Process for the Single Trench Half Tone Alternating PSM

An embodiment of the method for forming a single trench half tone alternating phase shift mask for use with light at a wavelength is described below.

Referring to FIG. 4A, we provide a substrate having: a phase shift region (20), a half tone region (26) and an unshifted phase region (24) and an opaque region (30).

The phase shift region (20) is adjacent to half tone region. The half tone region is adjacent to an unshifted phase region (24).

The substrate is preferably a mask blank comprised of quartz. Preferably the substrate has about a 100% transmittance and about a 0 degree phase shift.

A. Half Tone Layer 101 and Opaque Layer 102

Referring to FIG. 4A, we form a half tone layer 101 over the substrate 100. The half tone layer 101 is preferably comprised of: molybdenum silicide, molybdenum silicon oxide, silicon nitride, or silicon oxinitride.

Tuning the transmission of the half tone layer can corrected the placement error of Levenson's PSM. This allows the embodiment mask to equalize the intensity of the light thru the phase shift region and unshifted region. This compensates for the intensity imbalance of a Levenson alt-PSM. Varying the thickness of the half tone layer will change the transmission rate. By proper optimization of half tone transmission and thickness, intensity imbalance can be compensated without any undercutting.

Next, we form an opaque layer 102 on the half tone layer 101. The opaque layer 102 is preferably comprised of chrome.

B. Pattern the Opaque Layer 102 on the Half Tone Layer 101

Still referring to FIG. 4A, we form a first resist layer 103 on the opaque layer 102.

As shown in FIG. 4B, we expose and develop the resist layer to remove portions of the first resist layer to form a first resist pattern 103A over the half tone region 26 and the opaque region 30. The first resist pattern preferably has first resist layer openings 110 over the phase shift region (20) and an unshifted phase region (24). The first resist layer can be negative or positive type photoresist.

Referring to FIG. 4C, we pattern the opaque layer 102 and half tone layer 101 using the first resist pattern 103A as a mask to form a first opaque layer/half tone layer pattern 102A 101A over the half tone region 26 and form a first openings 114 (in the opaque pattern and half tone pattern) to expose the substrate 100 in the phase shift region (20) and an unshifted phase region (24).

The patterning the opaque layer 102 on the half tone layer 101 is preferably performed using a reactive ion etch.

Referring to FIG. 4D, we remove the first resist layer 103.

C. Form a Trench 32 in the Phase Shift Region 20

As shown in FIG. 4E, we form a second resist layer 104 over the opaque layer 102 on the half tone layer 101 and the substrate 100.

As shown in FIG. 4F, we expose and develop the second resist layer to remove portions of the second resist layer 104 to form a second resist pattern 104A over the unshifted region 24 and the opaque region 30. The second resist pattern 104A has second resist layer openings 120 over the phase shift region 20.

As displayed in FIG. 4G, we form a trench 32 in the phase shift region 20. The trench preferably has a depth 33 so that the phase shift region 20 has a phase shift of about 180 degrees with respect to light transmitted through the unshifted phase region. The trench can be etch. The trench can have straight or rounded sidewalls. The bottom of the trench is preferably flat. An advantage of the embodiment is that the trench can have flat sidewalls and bottom and the trench does not have to be undercut. This reduces manufacturing costs.

Referring to FIG. 4H, we remove the second resist pattern 104A.

D. Remove the First Opaque Layer Pattern 102A from Over the Half Tone Region

As shown in FIG. 4I, we form a third resist layer 105 over the substrate.

As shown in FIG. 4J, we remove portions of the third resist layer 105 to form a third resist layer pattern 105A over the opaque region 30 and to form third resist layer openings 124 to expose the phase shift region (20), the half tone region 26 and an unshifted phase region (24).

As shown in FIG. 4K, we remove the opaque layer 102 from over the half tone region layer 101 in the half tone regions 26 to leave half tone patterns 102B.

Also, the half tone patterns 101A can be etched backed to obtain the desired transmission. The optimized transmission of the half tone material can be varied by controlling the etch removal rate.

Referring to FIG. 4L, we remove the third resist layer 105. FIG. 4L shows an opaque section D which is comprised of a opaque region 30 of the substrate and the opaque layer 102B. Preferably the unshifted section is comprised of the un-etched or un-thinned mask substrate.

Second Embodiment—a Dual Trench Half Tone Alternating Phase Shift Mask

As shown in FIG. 5, a second embodiment comprises a dual trench half tone phase shift mask 200. The mask 200 comprises a first phase shift section R, a half tone section S, and a second phase shift section T.

The first phase shift section adjacent to the half tone section. The half tone section is adjacent to the second phase shift section. The first phase shift section R and half tone section S change the phase of incident light by about 180 degrees with respect to the second phase shift section T.

The first phase shift section is comprised of (i) a first phase shift region 220 of a mask substrate 204 and (ii) a first trench 232 in the first phase shift region. The half tone section S is preferably comprised of a half tone region 226 of the mask substrate and a half tone layer 234 over the half tone region. The second phase shift section T is preferably comprised of (a) a second phase shift region 222 of the mask substrate and (b) a second trench 236 in the second phase shift region. The second phase shift section preferably has about a 90 degree phase shift of incident light.

The substrate 204 has at least a first phase shift region 220, a half tone region 226 and an second phase shift region 222.

The first phase shift region 220 is adjacent to the half tone region 226.

The half tone region 226 is adjacent to the second phase shift region 222.

The first phase shift section and half tone section preferably shift transmitted light about 270 degrees phase with respect to transmitted light thru the (unshifted and unetched) quartz substrate surface.

The half tone section (S) has a phase shift of about 270 degrees with the light at the wavelength with respect to transmitted light thru the (unshifted and unetched) quartz substrate surface. The half tone layer has a transmittance between about 0.1 and 98% and more preferably between about 3 and 30%.

The second phase shift section (T) has about a 90 degree phase shift with respect to light transmitted thru the substrate (non-etched and non-shifted).

A. First Phase Shift Region 220

A first trench 232 in the substrate in the first phase shift region 220. The first trench has a depth such that the light at the wavelength transmitted through the first phase shift region (220) is shifted in phase by 180 degrees relative to the light at the wavelength transmitted thru the mask substrate. The first phase shift region 220 has about a 100% transmittance.

B. Half Tone Layer 234

A half tone layer 234 (partially transmitting phase shift layer) is over the mask substrate 10 in the half tone region 226. The half tone region has a phase shift of about 270 degrees with the light at the wavelength transmitted thru the mask substrate. The half tone layer has a transmittance between about 0 and 100% and more preferably between 1 and 98% and more preferably between about 3 and 30%.

C. Second Phase Shift Region 222

The second phase shift region 222 has an about 180 degree phase shift with respect to light thru the first shifted phase region (220) and the half tone region 226.

A second trench 236 is in the substrate in the second phase shift region 222. The trench has a depth 237 such that light that at the wavelength transmitted through the second phase shift region (222) is shifted in phase by 90 degrees relative light transmitted thru the substrate.

The second trench 236 has a depth such that light that at the wavelength transmitted through the second phase shift region (222) is shifted in phase by 180 degrees relative light transmitted thru the first phase shift region 220.

The second phase shift region 222 has about a 100% transmittance.

Light thru the $1^{st}$ phase shift region 220 is about 180 degree out of phase with light transmitted thru the half tone region/layer 226 234 and the $2^{nd}$ phase shift region 222. Light thru half tone region 226 and half tone layer 234 is about in phase with transmitted light thru the second phase shift region 222.

TABLE 2

Preferred Characteristics of the dual trench half tone alt-phase shift mask.

| Region | phase shift relative light transmitted thru the (unshifted) mask substrate (degrees) | transmittance (%) |
|---|---|---|
| first phase shift section (R) | 270 degrees<br>range = 268 to 272 degrees | 100%<br>range = 95 to 100% |
| half tone section (S) | 270 degrees<br><br>range = 268 to 272 degrees | most preferred<br>range = 3 to 30%<br>preferred<br>range = 0.1 to 98% |
| second phase shift section (T) | 90 degrees<br>range = 88 to 92 degrees | 100%<br>range = 95 to 100% |
| opaque section (U) | not applicable | 0 |

D. E Field Graph

Figure 6:
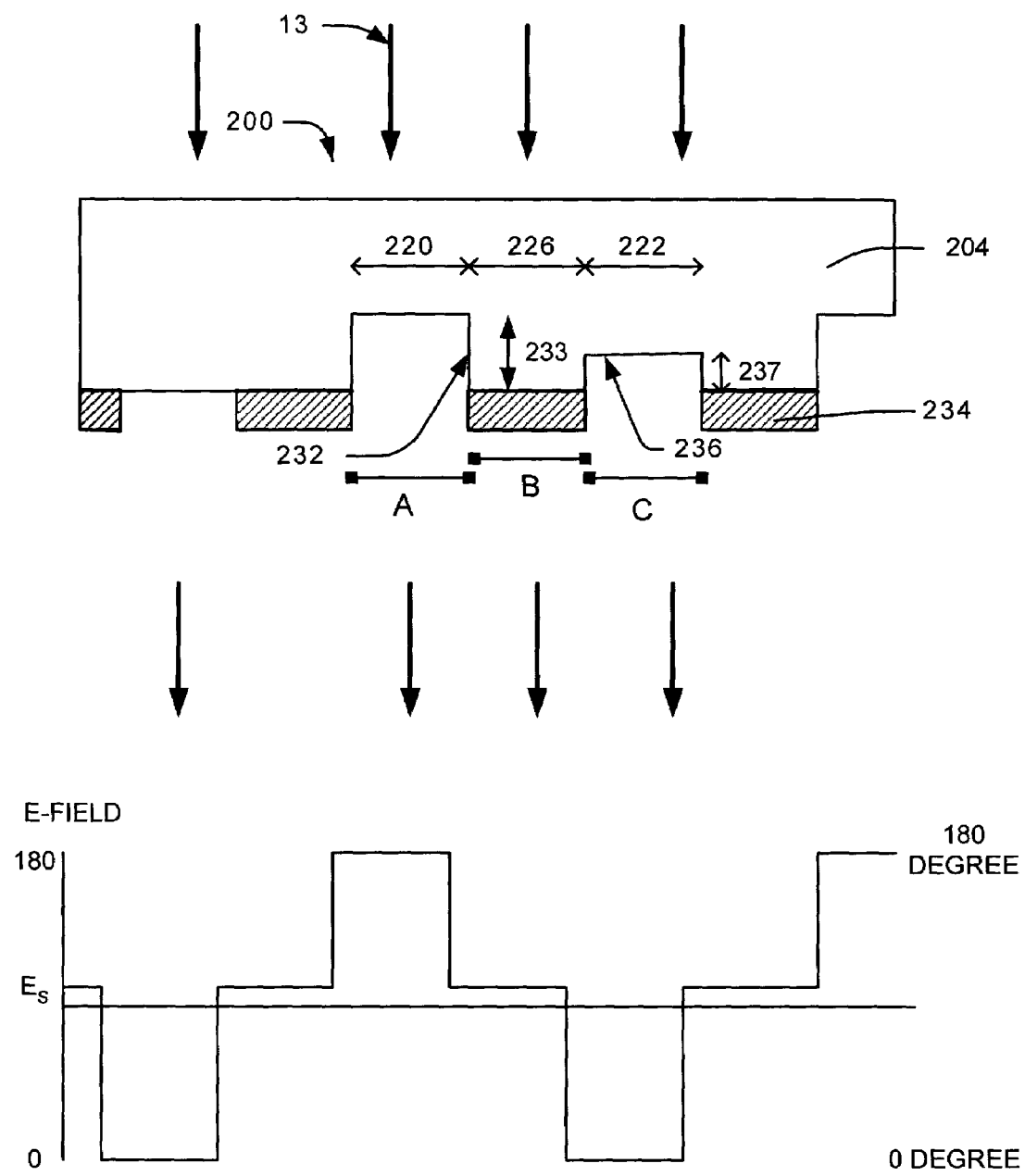
FIG. 6 is a cross sectional view of a dual trench half tone alternating phase shift mask and graph of E-field according to an embodiment of the present invention.

FIG. 6 is a cross sectional view of a dual trench half tone phase shift mask and graph of E-field at the mask surface according to an embodiment of the present invention. The amplitude of $E_s$ is dependent on the light transmission thru the half tone material in region S.

Method for Forming the Dual Trench Half Tone Alternating PSM

An embodiment of the method for forming a (dual trench) half tone alternating phase shift mask is described below.

A. Mask Substrate

Figure 8A:
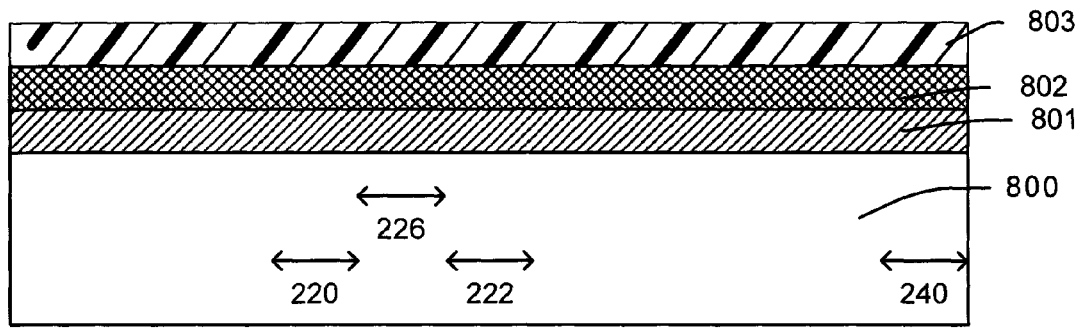
FIGS. 8A to 8M are cross sectional views of a process to make a dual trench half tone alternating phase shift mask according to an embodiment of the present invention.

Referring to FIG. 8A, we provide a mask substrate 800 having: a first phase shift region (220), a half tone region 226 and a second shifted phase region (222) and an opaque region 240.

The first phase shift region (220) is adjacent to half tone region (226). The half tone region is adjacent to an second shifted phase region (222).

The substrate is preferably a mask blank comprised of quartz. Preferably the substrate has about a 100% transmittance and about a 0 phase shift.

B. Half Tone Layer 801 and Opaque Layer 802

Referring to FIG. 8A, we form a half tone layer 801 over the substrate 800. The half tone layer 801 is preferably comprised of: molybdenum silicide, molybdenum silicon oxide, silicon nitride, or silicon oxinitride.

Tuning the transmission of the half tone layer can correct the placement error of Levenson's PSM, thus compensate intensity imbalance of Levenson PSM between the phase shifted and unshifted regions. Varying the thickness of the half tone layer will change the transmission rate. By proper optimization of half tone transmission and thickness, intensity imbalance can be compensated without any trench undercutting.

Next, we form an opaque layer 802 on the half tone layer 801. The opaque layer 802 is preferably comprised of chrome.

C. *Pattern the Opaque Layer 802 on the Half Tone Layer 801

Still referring to FIG. 8A, we form a first resist layer 803 on the opaque layer 802.

Figure 8B:
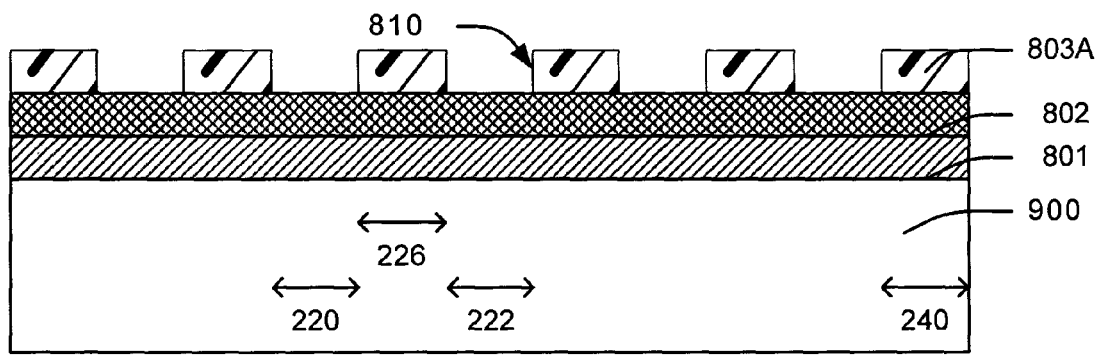

As shown in FIG. 8B, we expose and develop the first resist layer to remove portions of the first resist layer to form a first resist pattern 803A over the half tone region 226 and the opaque region 240 The first resist pattern preferably has first resist layer openings 810 over the first phase shift region (220) and an second phase region (222). The first resist layer can be negative or positive type photoresist.

Figure 8C:
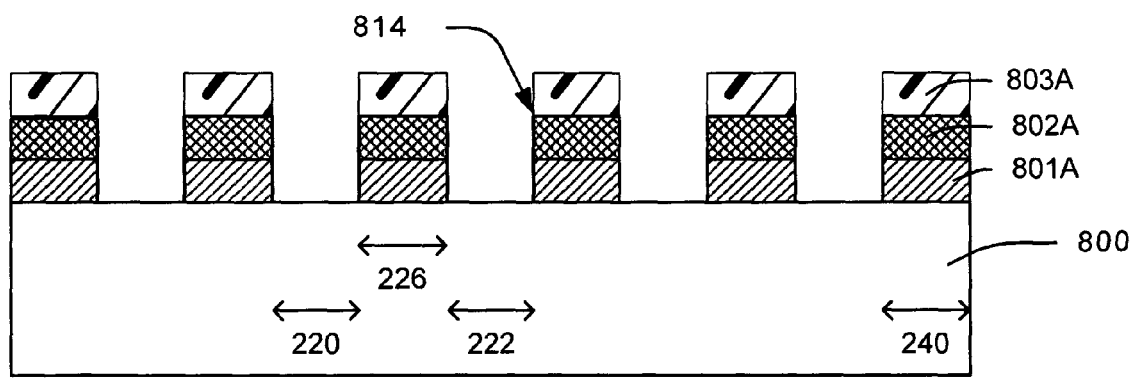
Figure 8D:
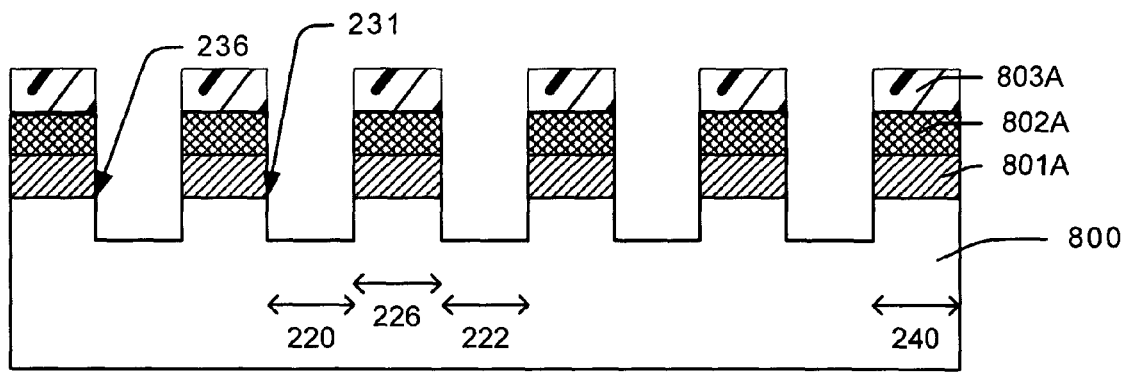

Referring to FIG. 8C, we pattern the opaque layer 802 and half tone layer 801 using the first resist pattern 803A as a mask to form a first opaque layer/half tone layer pattern 802A 801A over the half tone region 26 and form first openings 814 (in the opaque layer and half tone layer) to expose the substrate 800 in the first phase shift region (220) and an second phase region (222).

The patterning of the opaque layer 802 on the half tone layer 801 is preferably performed using a reactive ion etch.

D. Form Trenches 231 and 236

Partial first trenches 231 are etched in the first phase shift regions 220 and second trenches 236 are etched in the substrate 800 in the second phase shift region 222.

The second trenches 236 are preferably etched to a depth to produce a phase shift of 180 degree relative to the light transmitted thru the (not yet formed) first trenches 220 (see FIG. 5). Preferably the second trench is etched to a depth 237 that phase shifts light about 90 degree relative to the unetched (full thickness) substrate.

Figure 8E:
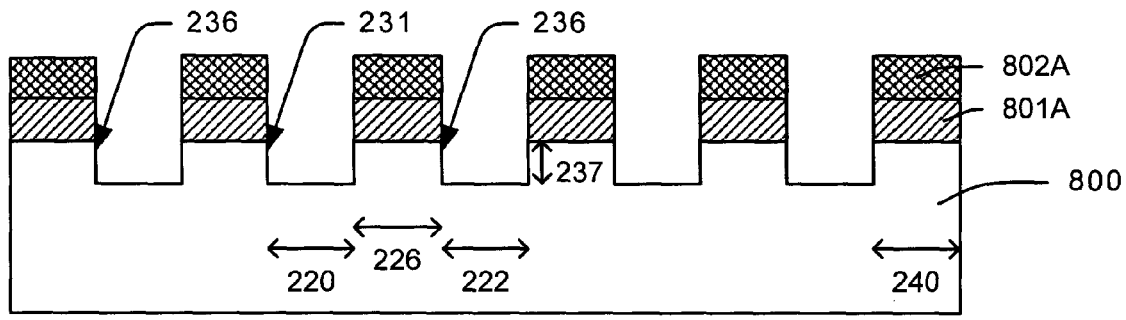

Referring to FIG. 8E, we remove the first resist layer 180.

E. Form a Second Resist Layer 804

Figure 8F:
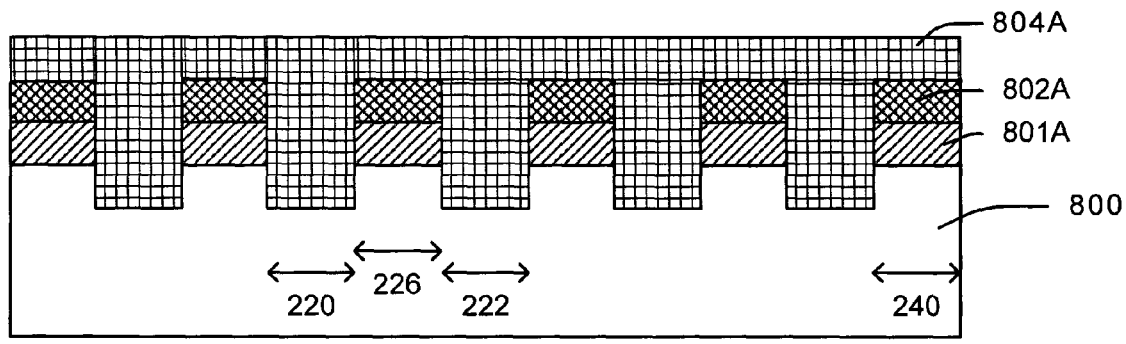

As shown in FIG. 8F, we form a second resist layer 804 over the opaque layer 802 on the half tone layer 801 and the substrate 800.

F. Form a Second Resist Pattern 802A

Figure 8G:
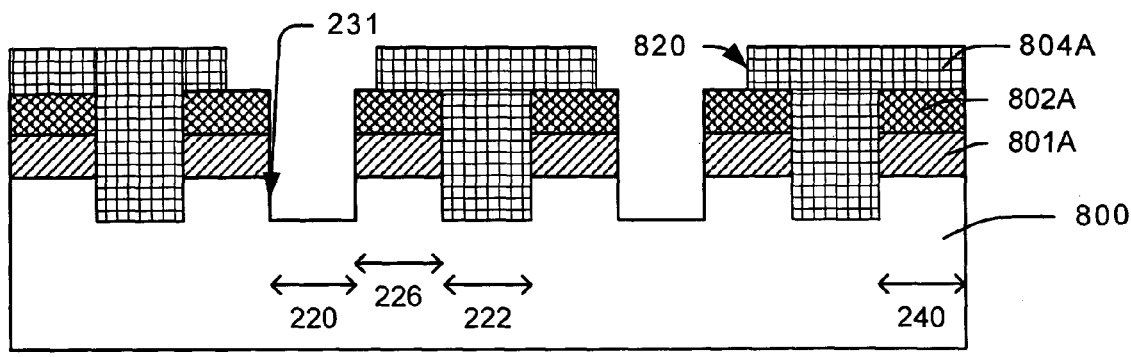

As shown in FIG. 8G, we remove portions of the second resist layer 804 to form a second resist pattern 802A over the second phase shift region 222 and the opaque region 240. Also, we form second resist layer openings 820 over the first phase shift region 220.

G. Form a First Trench 232 in the First Phase Shift Region 220

Figure 8H:
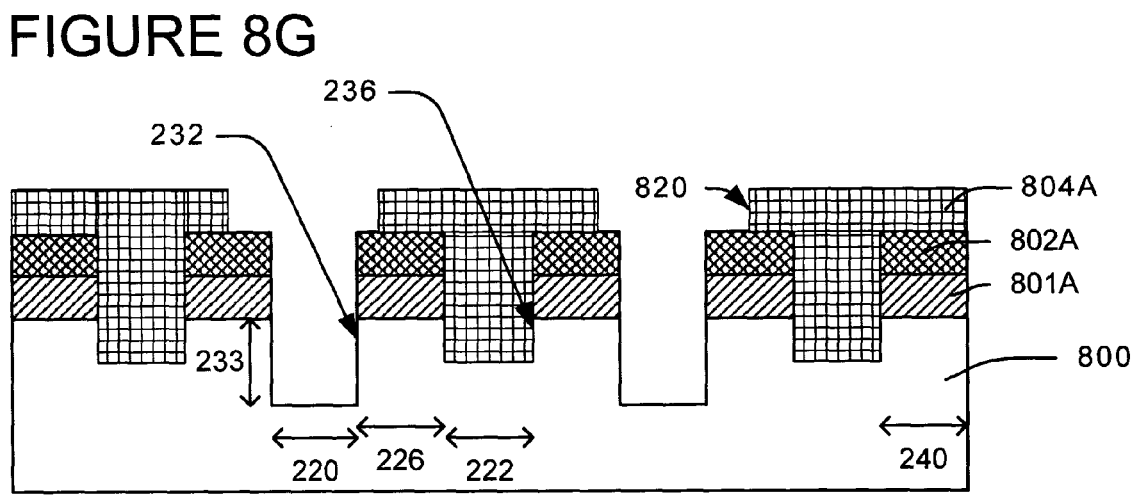

Referring to FIG. 8H, we form a first trench 232 in the first phase shift region 220. The first trench 232 has a depth 233 so that the first phase shift region 220 has a phase shift of about 180 degrees relative to the second phase shift region 222 (second trench 236). Preferably the first trench is etched to a depth that phase shifts light about 270 degree relative to the unetched (full thickness) substrate.

Figure 8I:
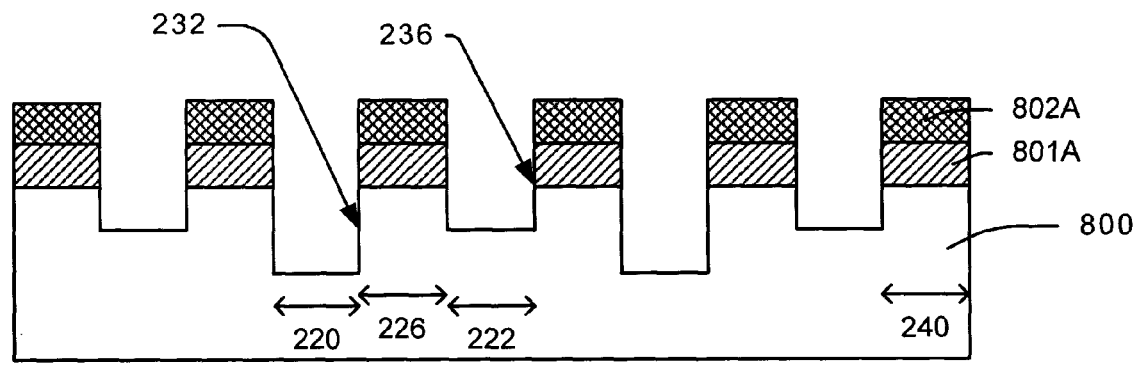

As shown in FIG. 8I, we remove the second resist pattern 804A.

H. Third Resist Pattern 805A

Figure 8J:
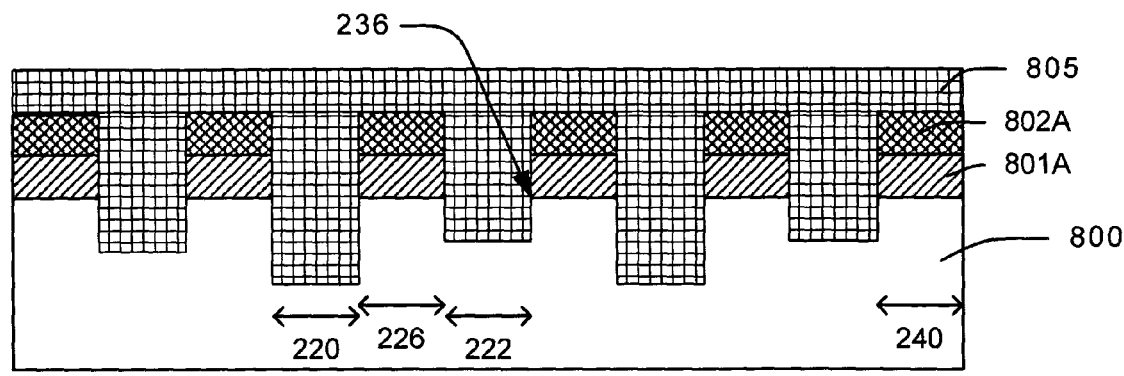

As shown in FIG. 8J, we form a third resist layer 805 over the substrate.

Figure 8K:
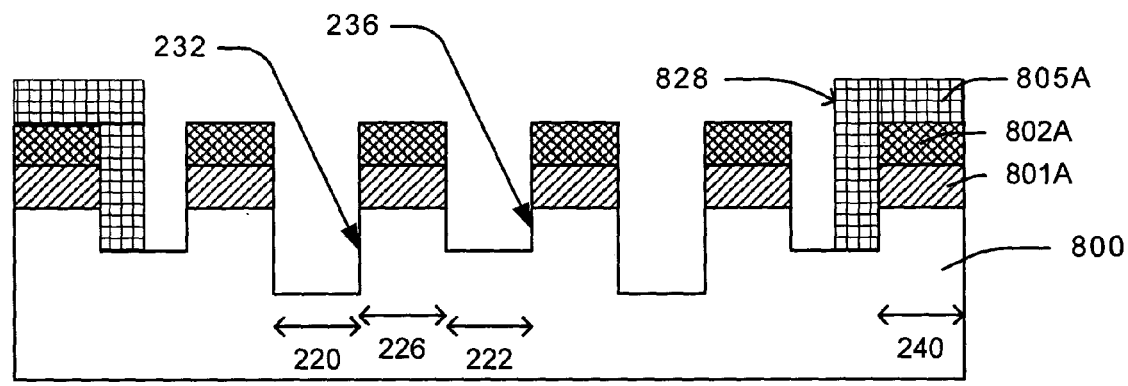

As shown in FIG. 8K we removing portions of the third resist layer 105 to form a third resist pattern 805A over the opaque region 240 and to form a third resist layer openings 828 to expose the half tone pattern 801A in the first phase shift regions 220, and the half tone region 226 and an second phase shift region (222).

I. Remove the Opaque Patterns 102A From Over the Half Tone Pattern 801A in the Half Tone Regions 226

Figure 8L:
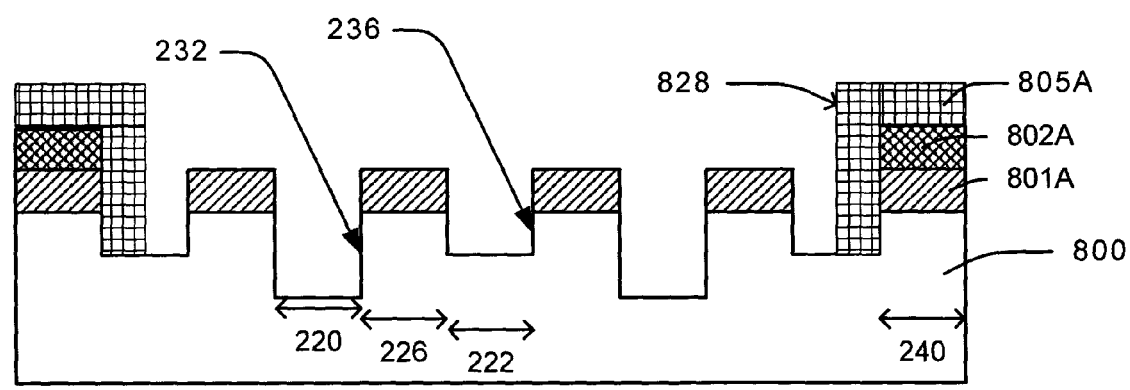

As shown in FIG. 8L, we remove the opaque patterns 102A from over the half tone pattern 801A in the half tone regions 226. The opaque patterns 102A can be removed by either wet or dry etching.

The half tone patterns 810A can be etched backed to obtain the desired transmission. The optimized transmission of the half tone material can be varied by controlling the etch removal rate.

The transmission of the half tone patterns 810A can be optimized by etching (or thinning) the half tone patterns 810.

Figure 8M:
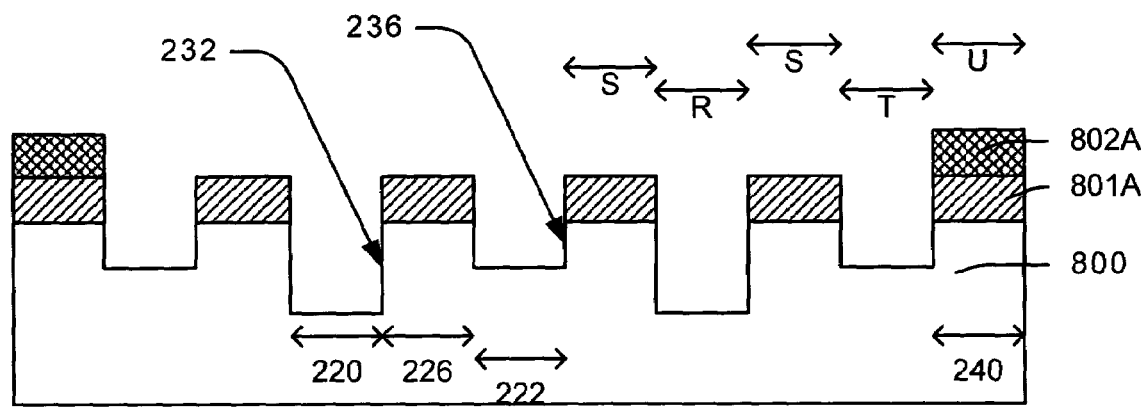

As shown in FIG. 8M, we remove the third resist pattern 105A. FIG. 8M shows an opaque section U that comprises the opaque layer 802a over an opaque region 240 of the mask substrate.

Methods of Making Devices Using the Mask Embodiments

Embodiments include methods for making devices using the mask embodiments.

The method preferably comprises: (a) providing a phase shift mask comprising: a mask substrate having a first phase shift section, a half tone section and a second phase section. The first phase shift section adjacent to the half tone section. The half tone section adjacent to the second phase section. The first phase shift section and the half tone layer have about a 180 degree phase shift with the second phase section. The half tone layer has a transmittance between about 0.1 and 98%.

Then we (b) transmit radiation through portions of the phase shift mask to expose a pattern of photoresist overlying a semiconductor or electronic work piece.

Lastly, we (c) utilize the patterned photoresist to fabricate a semiconductor device.

Figure 9:
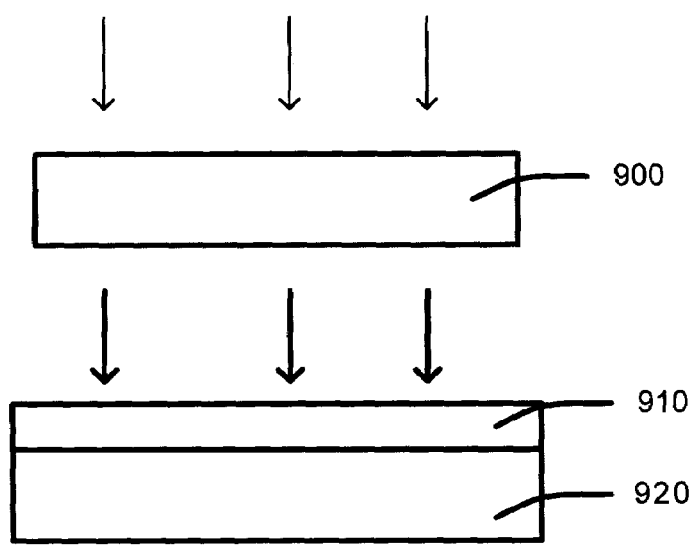
FIG. 9 shows a mask 900 of an embodiment of the invention with radiation transmitted thru the mask onto a resist layer 910 over a work piece 920 according to an embodiment of the invention.

FIG. 9 shows a mask 900 of an embodiment of the invention with light transmitted thru the mask onto a resist layer 910 over a work piece.

Advantages

Embodiments of the invention use a half tone layer and trenches preferably without trench undercut on the mask. The transmission rate of the half tone layer can range from >0.1 to <100%, and more preferably from about 3% to 30%, depending on the need of the mask process and wafer process to achieve intensity balance for 0 and 180 degree as in the case of single trench half tone alt-PSM type, and for 90 and 270 degree as in the case of duel trench half tone alt-PSM type.

Tuning the transmission of the half tone layer can corrected the placement error of Levenson's PSM, thus compensate intensity imbalance of Levenson PSM. Varying the thickness of the half tone layer will change the transmission rate. By proper optimization of half tone transmission and thickness, intensity imbalance can be compensated without any undercutting.

Improvements Over Levenson's PSM

Problems with Undercutting Trenches in Levenson's PSM

The inventors have found that the intensity imbalance on Levenson phase shifting mask (PSM) causes the placement error of the pattern feature during the photolithography process. Single (0/180 degree) and dual (90/270 degree) trench alt-PSM employs undercutting of the quartz in order to correct the intensity imbalance. However, the problem of undercuts is the high probability of the chrome been lifted off during mask manufacturing or cleaning process as the adhesive area of the chrome to the quartz is reduced. Chrome lifting limits the amount of undercuts to correct the intensity imbalance and features to go smaller as higher risk of chrome lifting due to right amount of undercut needed. Thus greatly reduce the application of Levenson PSM.

Problems with Interference at the Air to Quartz Boundary Surface in Levenson PSM's In Levenson's PSM shown in FIG. 7, the interference at the air to quartz boundary surface (shown in region G) lowers the intensity between the etched region E and the unetched region F. The imbalance in the intensity caused the patterned resist line on the wafer to appear displaced towards the region of lower intensity. That is the intensity of light $E_E$ is less than the intensity of light $E_F$ The embodiments of the invention has half tone material on the unetch regions, not opaque. The half tone material allows lights to pass through it while maintaining the phase shift of the light, thus enabling the intensity to increase in the etched region with the same phase. Although the amplitude of the etched region will not match totally with the unetched region using this method, the increase in intensity level at the threshold level which is needed to exposure the resist is matched. In this way, the patterned line will not appear to be displaced.

As the intensity at the etched region that is needed to be balance with the intensity at the unetched region is dependent on the transmission of the the half tone material, detetmining the transmission level is cruical. Optimization of to the design CD and space is needed with the transmission level is needed. This is achieved by measuring the CD of the space produce by the etch and unetched region through simulation or experimental result from patterened line with varying half tone material transmission. From the simulation result, if both CDs of the spacing is the same, the intensity is balance, else the difference in the CD will cause the line to appeared shifted. Experimental result will yeild the same result, however it is more rigous. The transmission of the half tone material can be varied by tuning the thickness while the phase can be tuned by the material used.

The half tone alternating PSM masks of the invention may be used in other types of PSMs. Also, substructive alternating PSM methods are illustrated, but additive half tone alternative PSM mask may be fabricated using the invention. Also, the embodiments of the PSM eliminated the need for slope sidewalls trenches, but it may be advantagous to form sloped sidewall trenches in the embodiment's half tone single and dual trench alt-PSM.

The half tone alt-PSM's of the invention can be used to expose photoresist in the manufacture of semiconductor, electronics and other devices. The embodiments are suitable for defining conductive lines and patterns in resist for semiconductor devices.

The above-described embodiments are meant to be illustrative of the invention and not limiting. Modifications, alternatives, and variances to these embodiments may be apparent to those skilled in the art. For example, although the above description refers to a 0 degree and 180 degree phase, the present invention is equally applicable to other embodiments in which the regions have different phases. In those embodiments, the relative phase between the regions is approximately 180 degrees. Thus, the 0 degree phase for a region and the 180 degree phase for another region, although providing one specific embodiment, also indicate the phases for these two regions relative to one another.

In the above description numerous specific details are set forth in order to provide a more thorough understanding of the present invention. It will be obvious, however, to one skilled in the art that the present invention may be practiced without these details. In other instances, well known process have not been described in detail in order to not unnecessarily obscure the present invention.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A phase shift mask for use with light at a wavelength comprising:
    a first phase shift section, a half tone section, and a second phase shift section;
    said first phase shift section adjacent to said half tone section;
    said half tone section adjacent to said second phase shift section;
    said first phase shift section and half tone section changing the phase of transmitted light by about 180 degrees with respect to said second phase shift section.
2. The phase shift mask of claim 1 which further includes said first phase shift section comprised of a first phase shift region of a mask substrate;
    a trench in said first phase shift region; and
    said half tone section comprised of (i) a half tone region of said mask substrate and (ii) a half tone layer over said half tone region;
    said second phase shift section has about a 0 degree phase shift.
3. The phase shift mask of claim 1 which further includes:
    said first phase shift section comprised of (i) a first phase shift region of a mask substrate and (ii) a first trench in said first phase shift region;
    said half tone section comprised of a half tone region of said mask substrate and a half tone layer over said half tone region; said half tone layer has a transmittance between about 3 and 30%; and
    said second phase shift section has about a 0 degree phase shift.
4. The phase shift mask of claim 1 which further includes:
    said first phase shift section comprised of (i) a first phase shift region of a mask substrate and (ii) a first trench in said first phase shift region; and
    said half tone section comprised of a half tone region of said mask substrate and a half tone layer over said half tone region;
    said half tone layer has a transmittance between about 3 and 30%;
    said second phase shift section comprised of (a) a second phase shift region of said mask substrate and (b) a second trench in said second phase shift region;
    said second phase shift section has about a 90 degree phase shift.
5. The phase shift mask of claim 1 wherein said second phase shift region has about a 100% transmittance.
6. The phase shift mask of claim 1 wherein said half tone section has a transmittance that balances the light intensities transmitted through said first phase shift region and said second phase shift region so that the light intensities are about equal.
7. A semiconductor device or an electronics device formed by using the phase shift mask of claim 1.
8. A phase shift mask for use with light at a wavelength comprising:
    a mask substrate having a first phase shift region, a half tone region, and a second phase shift region;
    said first phase shift region adjacent to said half tone region;
    said half tone region adjacent to said second phase shift region;
    a half tone layer over said half tone region;
    said first phase shift region and half tone layer changing the phase of transmitted light by about 180 degrees with respect to said second phase shift region.
9. The phase shift mask of claim 8 which further includes a trench in said mask substrate in said first phase shift region; and
    said second phase shift region has about a 0 degree phase shift; and
    said half tone region has a transmittance between about 0.1 and 98%.
10. The phase shift mask of claim 8 which further includes a trench in said mask substrate in said second phase shift region; and
    said first phase shift region has about a 0 degree phase shift;
    said half tone layer has a transmittance between about 3 and 30%.
11. The phase shift mask of claim 8 which further includes:
    a first trench in said first phase shift region; and
    a second trench in said second phase shift region; and
    said half tone layer has a transmittance between about 3 and 30%.
12. The phase shift mask of claim 8 wherein said half tone layer has a transmittance between about 3 and 30%.

13. The phase shift mask of claim 8 wherein said second phase shift region has about a 100% transmittance.

14. The phase shift mask of claim 8 wherein said half tone layer has a transmittance that balances the light intensities transmitted through said first phase shift region and said second phase shift region so that the light intensities are about equal.

15. A semiconductor device or an electronics device formed by using the phase shift mask of claim 8.

16. A phase shift mask for use with light at a wavelength comprising:
   a mask substrate having a phase shift region, a half tone region and an unshifted phase region;
   a half tone layer over said half tone region;
   said phase shift region adjacent to said half tone region;
   said half tone region adjacent to said unshifted phase region;
   said phase shift region has about a 180 degree phase shift with respect to said unshifted phase region,
   said half tone layer has a phase shift of about a 180 degrees with respect to said unshifted phase region, said half tone layer has a transmittance between about 3 and 30%.

17. The phase shift mask of claim 16 which further includes a trench in said phase shift region.

18. The phase shift mask of claim 16 wherein said unshifted phase region has about a 100 % transmittance and about a 0 degree phase shift with the incoming light.

19. The phase shift mask of claim 16 wherein said phase shift region has a phase shift such that light that at said wavelength transmitted through said phase shift region is shifted in phase by about 180 degrees relative to said light at said wavelength transmitted through said unshifted phase region.

20. The phase shift mask of claim 16 wherein said half tone region has a transmittance that balances the light intensities transmitted through said phase shift region and said unshifted region so that the light intensities are about equal.

21. A semiconductor device formed by using the phase shift mask of claim 16.

22. A phase shift mask for use with light at a wavelength comprising:
   a) a mask substrate has a first phase shift region, a half tone region and an second phase shift region;
   b) a half tone layer over said half tone region; said half tone layer has a transmittance between about 0.1 and 98%;
   c) said first phase shift region and half tone layer have an about 180 degree phase shift with respect to said second phase shift region;
   d) said first phase shift region adjacent to said half tone region;
   e) said half tone region adjacent to said second phase shift region.

23. The phase shift mask of claim 22 wherein a first trench in said first phase shift region; said first phase shift region has about a 100% transmittance.

24. The phase shift mask of claim 22 wherein said half tone layer has a transmittance between about 3 and 30%.

25. The phase shift mask of claim 22 wherein said second phase shift region has about a 100% transmittance.

26. A semiconductor device or an electronics device formed by using the phase shift mask of claim 22.

27. A method for forming a single trench half tone phase shift mask for use with light at a wavelength comprising:
   a) providing a substrate having a phase shift region, a half tone region and an unshifted phase region; said phase shift region adjacent to said half tone region; said half tone region adjacent to said unshifted phase region;
   b) forming a half tone layer on said substrate in said half tone region; said half tone layer has a phase shift of about 180 degrees with said unshifted phase region, said half tone layer has a transmittance between about 3 and 30%;
   c) forming a trench in said substrate in said phase shift region; said phase shift region has an about 180 degree phase shift with said unshifted phase region.

28. The method of claim 27 wherein said trench formed to a first depth such that light that at said wavelength transmitted through said phase shift region is shifted in phase by 180 degrees relative to said light at said wavelength transmitted through said unshifted phase region.

29. A method for forming a half tone single trench phase shift mask for use with light at a wavelength comprising:
   a) providing a substrate having a phase shift region, a half tone region and an unshifted phase region and an opaque region; said phase shift region adjacent to half tone region; said half tone region adjacent to an unshifted phase region;
   b) forming a half tone layer on said substrate;
   c) forming an opaque layer on said half tone layer,
   d) forming a first resist layer on said opaque layer;
   e) removing portions of said first resist layer to form a first resist pattern over said half tone region and said opaque region;
   f) patterning said an opaque layer on said half tone layer using the first resist pattern as a mask form a first opaque pattern and a half tone pattern over said half tone region;
   g) removing said first resist layer;
   h) forming a second resist layer over said opaque layer on said half tone layer and said substrate;
   i) removing portions of said second resist layer to form a second resist pattern over said unshifted region and said opaque region and to form second resist layer openings over said phase shift region;
   j) forming a trench in said phase shift region; said trench has a depth so that said phase shift region has a phase shift of 180 degrees with said unshifted phase region;
   k) removing said second resist pattern;
   l) forming a third resist layer over said substrate;
   m) removing portions of said third resist layer to form a third resist layer pattern over the opaque region and to form a third resist layer openings to expose said phase shift region, said half tone region and an unshifted phase region;
   n) removing said opaque layer from over said half tone region layer in said half tone regions;
   o) removing said third resist layer.

30. The method of claim 29 wherein said half tone layer has a 180 degree phase shift relative to said unshifted phase region.

31. The method of claim 29 which further includes etching said half tone pattern to control the transmission of the said half tone pattern.

32. The method of claim 29 wherein said substrate is a mask blank comprised of quartz.

33. The method of claim 29 wherein said half tone layer is comprised of a material selected from the group consisting of: molybdenum silicide, molybdenum silicon oxide, silicon nitride, and silicon oxinitride.

34. The method of claim 29 wherein said opaque layer is comprised of chrome.

35. The method of claim 29 wherein the patterning said opaque layer on said half tone layer is performed using a reactive ion etch.

36. The method of claim 29 wherein said first resist layer is negative or positive type photoresist.

37. A method for a phase shift mask for use with light at a wavelength comprising:
  a) providing a mask substrate having a first phase shift region, a half tone region and an second phase shift region;
  b) said first phase shift region adjacent to said half tone region; said half tone region adjacent to said second phase shift region;
  c) forming a first trench in said substrate in said first phase shift region; said phase shift region has an about 180 degree phase shift with said unshifted phase region, said first phase shift region has about a 100% transmittance;
  d) forming a half tone layer on said mask substrate in said half tone region; said half tone layer has a phase shift of about 180 degrees with said first phase shift region; said half tone layer has a transmittance between about 0 and 100%;
  e) forming a second trench in said substrate in said second phase shift region; said second phase shift region has an about 180 degree phase shift with said first phase shift region.

38. The method of claim 37 wherein said first phase shift region creates a phase shift of about 270 degrees on incident light;
  said second phase shift region and said half tone layer creates a phase shift of about 90 degrees on incident light.

39. The method of claim 37 wherein said half tone layer has a transmittance between about 3 and 30%.

40. A method for forming a half tone dual trench phase shift mask for use with light at a wavelength comprising:
  a) providing a substrate having a first phase shift region, a half tone region and an second phase shift region and an opaque region; said first phase shift region adjacent to said half tone region; said half tone region adjacent said second phase shift region;
  b) forming a half tone layer on said substrate;
  c) forming an opaque layer on said half tone layer;
  d) forming a first resist layer on said opaque layer;
  e) removing portions of said first resist layer to form a first resist pattern over said half tone region and said opaque region;
  f) patterning said an opaque layer on said half tone layer using the first resist pattern as a mask form a first opaque pattern and a half tone pattern over said half tone region;
  g) forming second trenches in the substrate in the second phase shift region and partial first trenches in the first phase shift regions;
  h) removing said first resist layer;
  i) forming a second resist layer over said opaque layer on said half tone layer and said substrate;
  j) removing portions of said second resist layer to form a second resist pattern over said second phase shift region and said opaque region and to form second resist layer openings over said first phase shift region;
  k) forming a first trench in said first phase shift region; said first trench has a depth so that said first phase shift region has a phase shift of about 180 degrees relative to said second phase shift region;
  l) removing said second resist pattern;
  m) forming a third resist layer over said substrate;
  n) removing portions of said third resist layer to form a third resist pattern over said opaque region and to form a third resist layer openings to expose said half tone pattern in said first phase shift regions, and said half tone region and an second phase shift region;
  o) removing said opaque patterns from over said half tone pattern in said half tone regions;
  p) removing said third resist pattern.

41. The method of claim 40 wherein said first phase shift region creates a phase shift of about 270 degrees on incident light;
  said second phase shift region and said half tone layer creates a phase shift of about 90 degrees on incident light.

42. The method of claim 40 which further includes etching said half tone pattern to control the transmission of the said half tone pattern.

43. The method of claim 40 wherein said substrate is a mask blank comprised of quartz.

44. The method of claim 40 wherein said half tone layer is comprised of a material selected from the group consisting of: molybdenum silicide, molybdenum silicon oxide, silicon nitride, and silicon oxynitride.

45. The method of claim 40 wherein said opaque layer is comprised of chrome.

46. The method of claim 40 wherein the patterning said opaque layer on said half tone layer is performed using a reactive ion etch.

47. The method of claim 40 wherein said first resist layer is negative or positive type photoresist.

48. A method of fabricating a semiconductor device the method comprising:
  a) providing a phase shift mask comprising:
    (1) a mask substrate having a first phase shift section, a half tone section and a second phase section;
      said first phase shift section adjacent to said half tone section;
      said half tone section adjacent to said second phase section;
      said first phase shift section and said half tone section have about a 180 degree phase shift with said second phase section;
      said half tone section has a transmittance between about 0.1 and 98%;
  b) transmitting radiation through portions of the phase shift mask to expose a pattern of photoresist overlying a semiconductor workpiece; and
  c) utilizing the patterned photoresist to fabricate a semiconductor device or an electronics device.

49. The method of claim 48 wherein said half tone section comprises a half tone region of a mask substrate and a half tone layer over said half tone region, said half tone layer has a transmittance between about 3 and 30%.

50. The method of claim 48 wherein said phase shift mask further includes:
  said first phase shift section comprises a first phase shift region of a mask substrate;
  a first trench in said mask substrate in said first phase shift region; and
  said second phase section has about a 0 degree phase shift.

51. The method of claim 48 wherein said phase shift mask includes:
- a mask substrate having a first phase shift region, a half tone region and a second phase shift region;
- a first trench in said first phase shift region; and
- said first phase shift region has about a 0 degree phase shift;
- said half tone layer has a transmittance between about 3 and 30%; and
- a second trench in said second phase shift region.

52. The method of claim 48 wherein said phase shift mask includes:
- a mask substrate having a first phase shift region, a half tone region and a second phase shift region;
- a first trench in said mask substrate in said first phase shift region; and
- a second trench in said mask substrate in said second phase shift region; and
- said half tone layer has a transmittance between about 3 and 30%.

53. The method of claim 48 wherein said half tone region has a transmittance that about balances the light intensities transmitted through said first phase shift region and said second phase shift region so that the light intensities are about equal.

54. A method of fabricating a semiconductor device the method comprising:
- a) providing a single trench half tone phase mask comprising:
  - (1) a phase shift section, a half tone section and an unshifted phase section;
  - (2) said phase shift section adjacent to said half tone section;
  - (3) said half tone section adjacent to said unshifted phase section;
  - (4) said phase shift section has an about 180 degree phase shift with said unshifted phase section;
  - (5) said half tone section has a phase shift of about 180 degrees with said unshifted phase section, said half tone section has a transmittance between about 0.1 and 98%;
- b) transmitting radiation through portions of the phase shift mask to expose a pattern of photoresist overlying a semiconductor work piece; and
- c) utilizing the patterned photoresist to fabricate a semiconductor device or an electronics device.

55. The method of claim 54 wherein:
said first phase shift section comprised of a first phase shift region of a mask substrate;
a trench in said first phase shift region; and
said half tone section comprised of (i) a half tone region of said mask substrate and (ii) a half tone layer over said half tone region;
said second phase shift section has about a 0 degree phase shift.

56. The method of claim 54 wherein:
said first phase shift section comprised of (i) a first phase shift region of a mask substrate and (ii) a first trench in said first phase shift region;
said half tone section comprised of a half tone region of said mask substrate and a half tone layer over said half tone region; said half tone layer has a transmittance between about3and30%; and
said second phase shift section has about a 0 degree phase shift.

57. The method of claim 54 wherein said half tone layer has a transmittance between about 3 and 30%.

* * * * *